(12) United States Patent
Tanaka et al.

(10) Patent No.: US 11,190,138 B2
(45) Date of Patent: Nov. 30, 2021

(54) POWER AMPLIFIER CIRCUIT AND POWER AMPLIFIER MODULE

(71) Applicant: Murata Manufacturing Co., Ltd., Kyoto (JP)

(72) Inventors: Satoshi Tanaka, Kyoto (JP); Kazuo Watanabe, Kyoto (JP); Satoshi Arayashiki, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 59 days.

(21) Appl. No.: 16/721,062

(22) Filed: Dec. 19, 2019

(65) Prior Publication Data

US 2020/0212846 A1 Jul. 2, 2020

(30) Foreign Application Priority Data

Dec. 26, 2018 (JP) .............................. JP2018-243314

(51) Int. Cl.
| | |
|---|---|
| *H03F 1/22* | (2006.01) |
| *H03F 1/02* | (2006.01) |
| *H03F 1/56* | (2006.01) |
| *H03F 3/21* | (2006.01) |
| *H04B 1/16* | (2006.01) |
| *H04B 1/04* | (2006.01) |

(52) U.S. Cl.
CPC .............. *H03F 1/0211* (2013.01); *H03F 1/56* (2013.01); *H03F 3/21* (2013.01); *H03F 2200/171* (2013.01); *H03F 2200/387* (2013.01); *H03F 2200/451* (2013.01); *H04B 1/04* (2013.01); *H04B 1/16* (2013.01)

(58) Field of Classification Search
CPC ............... H03F 1/22; H03F 1/223; H03F 3/72
USPC ..................................................... 330/51, 311
See application file for complete search history.

(56) References Cited

U.S. PATENT DOCUMENTS

| | | | | |
|---|---|---|---|---|
| 6,066,993 | A * | 5/2000 | Yamamoto ............. | H03F 1/223 333/103 |
| 7,027,792 | B1 * | 4/2006 | Luff ..................... | H03D 7/1425 327/113 |
| 8,022,772 | B2 * | 9/2011 | Cassia .................... | H03F 1/223 330/311 |
| 9,893,684 | B2 | 2/2018 | Lehtola | |
| 10,135,395 | B2 | 11/2018 | Tanaka et al. | |
| 2003/0155980 | A1 * | 8/2003 | Heima .................... | H03F 1/223 330/311 |
| 2018/0183483 | A1 | 6/2018 | Kogure et al. | |
| 2020/0328724 | A1 * | 10/2020 | Ayranci ................... | H03F 3/72 |

FOREIGN PATENT DOCUMENTS

JP 2018-107502 A 7/2018

* cited by examiner

*Primary Examiner* — Steven J Mottola
(74) *Attorney, Agent, or Firm* — Pearne & Gordon LLP

(57) ABSTRACT

A power amplifier circuit includes a first transistor; a first bias circuit that supplies a first bias current or voltage; a capacitor; a first inductor; a second inductor; a second transistor; a second bias circuit that supplies a second bias current or voltage; a third inductor; a third transistor; a third bias circuit that supplies a third bias current or voltage; and a fourth inductor.

18 Claims, 17 Drawing Sheets

FIG. 8

| BAND Numbers | Up LINK | | Down LINK | |
|---|---|---|---|---|
| | f min | f max | f min | f max |
| 1 | 1920 | 1980 | 2110 | 2170 |
| 2 | 1850 | 1910 | 1930 | 1990 |
| 3 | 1710 | 1785 | 1805 | 1880 |
| 4 | 1710 | 1755 | 2110 | 2155 |
| 9 | 1749.9 | 1784.9 | 1844.9 | 1879.9 |
| 10 | 1710 | 1770 | 2110 | 2170 |
| 23 | 2000 | 2020 | 2180 | 2200 |
| 25 | 1850 | 1915 | 1930 | 1995 |
| 65 | 1920 | 2010 | 2110 | 2200 |
| 66 | 1710 | 1780 | 2110 | 2200 |
| 70 | 1695 | 1710 | 1995 | 2020 |
| 33 | 1900 | 1920 | - | - |
| 34 | 2010 | 2025 | - | - |
| 35 | 1850 | 1910 | - | - |
| 36 | 1930 | 1990 | - | - |
| 37 | 1910 | 1930 | - | - |
| 39 | 1880 | 1920 | - | - |

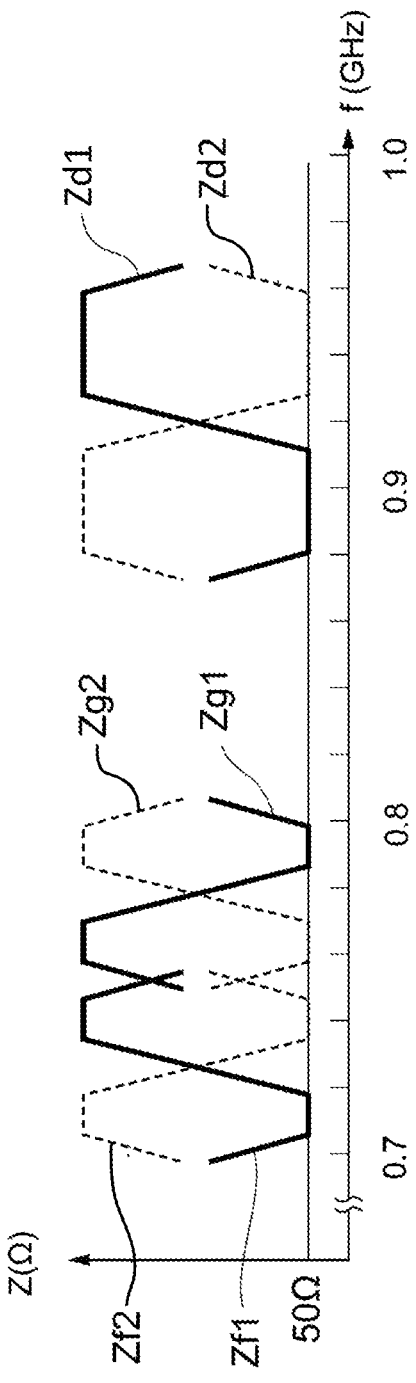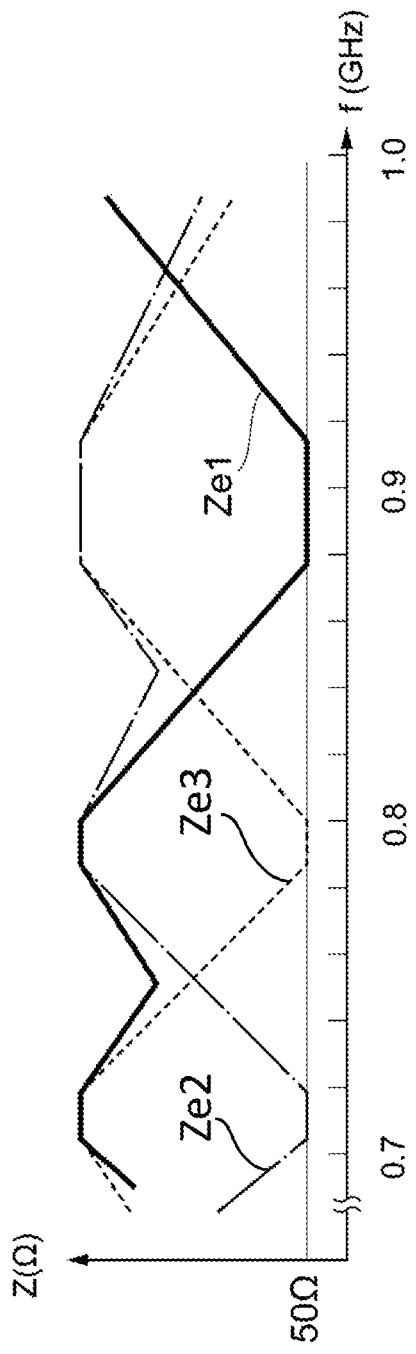
FIG. 13A
FIG. 13B

FIG. 14

| BAND Numbers | Up LINK | | Down LINK | |
|---|---|---|---|---|
| | f min | f max | f min | f max |
| 5 | 824 | 849 | 869 | 894 |
| 6 | 830 | 840 | 875 | 885 |
| 8 | 880 | 915 | 925 | 960 |
| 12 | 699 | 716 | 729 | 746 |
| 13 | 777 | 787 | 746 | 756 |
| 14 | 788 | 798 | 758 | 768 |
| 17 | 704 | 716 | 734 | 746 |
| 18 | 815 | 830 | 860 | 875 |
| 19 | 830 | 845 | 875 | 890 |
| 20 | 832 | 862 | 791 | 821 |
| 26 | 814 | 849 | 859 | 894 |
| 27 | 807 | 824 | 852 | 869 |
| 28 | 703 | 748 | 758 | 803 |
| 29 | - | - | 717 | 728 |
| 67 | - | - | 738 | 758 |
| 68 | 698 | 728 | 753 | 783 |
| 71 | 663 | 698 | 617 | 652 |
| 85 | 698 | 716 | 728 | 746 |
| 44 | 703 | 803 | - | - |

POWER AMPLIFIER CIRCUIT AND POWER AMPLIFIER MODULE

This application claims priority from Japanese Patent Application No. 2018-243314 filed on Dec. 26, 2018. The content of this application is incorporated herein by reference in its entirety.

BACKGROUND OF THE DISCLOSURE

1. Field of the Disclosure

The present disclosure relates to a power amplifier circuit and a power amplifier module.

2. Description of the Related Art

As a communication module used in a mobile communication device, such as a mobile phone, there is a communication module including a duplexer corresponding to a frequency band that performs transmission and reception. Japanese Unexamined Patent Application Publication No. 2018-107502 discloses a communication module including signal paths corresponding to respective multiple frequency bands. In each signal path, a duplexer corresponding to one of the multiple frequency bands is disposed. After a path is selected by a band-select switch, an output of a power amplifier circuit is supplied to the corresponding duplexer. An output from the duplexer is supplied to an antenna after a path is selected by an antenna switch.

In Japanese Unexamined Patent Application Publication No. 2018-107502, output paths for an output of the power amplifier circuit are switched in accordance with a frequency band by the switch. When an output signal from the power amplifier circuit passes through the switch, a loss of power occurs. To compensate for the loss due to the switch, output power of the power amplifier circuit has to be increased. An increase in output of the power amplifier circuit leads to an increase in power consumption of the power amplifier circuit.

BRIEF SUMMARY OF THE DISCLOSURE

The present disclosure has been made in consideration of such circumstances to provide a power amplifier circuit and a power amplifier module that enable low power consumption.

A power amplifier circuit according to an aspect of the present disclosure includes a first transistor; a first bias circuit configured to supply a first bias current or voltage; a capacitor; a first inductor; a second inductor; a second transistor; a second bias circuit configured to supply a second bias current or voltage; a third inductor; a third transistor; a third bias circuit configured to supply a third bias current or voltage; and a fourth inductor. A first power-supply voltage is supplied to a collector of the first transistor through the first inductor, an emitter of the first transistor is grounded, and a radio frequency signal is supplied to a base of the first transistor. A second power-supply voltage is supplied to a collector of the second transistor through the third inductor, and the second power-supply voltage is supplied to a collector of the third transistor through the fourth inductor. A first amplified signal from the collector of the first transistor is supplied to an emitter of the second transistor and an emitter of the third transistor through the capacitor. The emitter of the second transistor and the emitter of the third transistor are grounded through the second inductor. When the second bias current or voltage is supplied to a base of the second transistor, a second amplified signal obtained by amplifying the radio frequency signal is outputted from the collector of the second transistor, and, when the third bias current or voltage is supplied to a base of the third transistor, a third amplified signal obtained by amplifying the radio frequency signal is outputted from the collector of the third transistor.

The present disclosure can provide the power amplifier circuit and a power amplifier module that enable a reduction in radio-frequency signal loss.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 8 illustrates a frequency band configuration in a 2 GHz band for long term evolution (LTE) communications;

FIG. 13A illustrates input impedances of duplexers as seen from an antenna switch, and FIG. 13B illustrates input impedances of the duplexers as seen from the power amplifier circuit;

FIG. 14 illustrates a frequency band configuration in a 1 GHz band for LTE communications;

DETAILED DESCRIPTION OF THE DISCLOSURE

Figure 1:
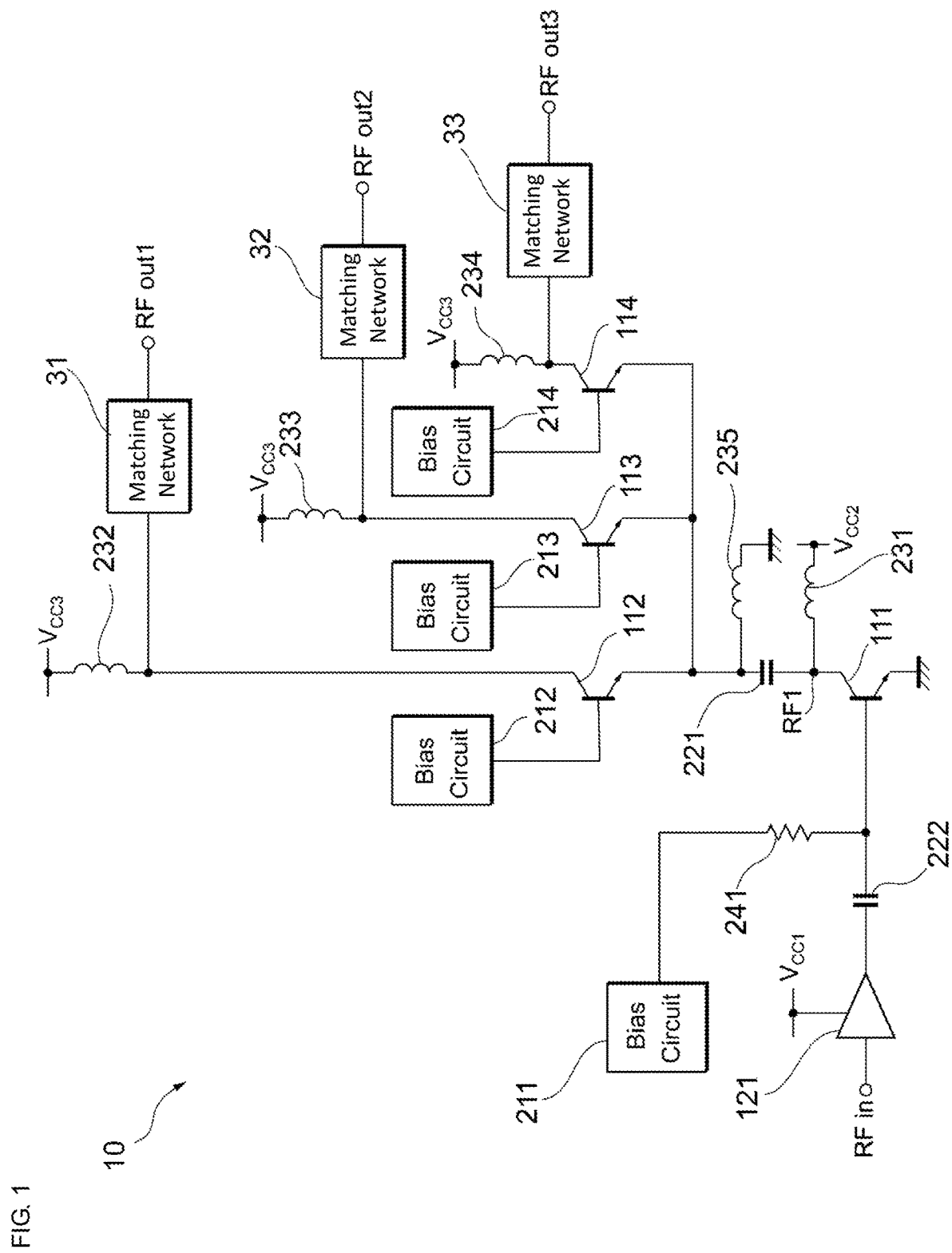
FIG. 1 illustrates an example of a configuration of a power amplifier circuit according to a first embodiment of the present disclosure.

Embodiments of the present disclosure will be described in detail below with reference to the drawings. The same elements are denoted by the same reference numerals, and a repeated description thereof is omitted as much as possible. In the embodiments, a radio frequency signal is referred to as "RF signal".

A first embodiment will be described. As illustrated in FIG. 1, a power amplifier circuit 10 includes transistors 111, 112, 113, and 114, an amplifier 121, bias circuits 211, 212, 213, and 214, capacitors 221 and 222, inductors 231, 232, 233, 234, and 235, a resistance element 241, and matching networks 31, 32, and 33.

Each of the transistors 111, 112, 113, and 114 is, for example, a transistor, such as a heterojunction bipolar transistor (HBT). In the present disclosure, each transistor is not limited to a heterojunction bipolar transistor, and another transistor, such as a field-effect transistor (FET), may be used.

A power-supply voltage Vcc2 is supplied to a collector of the transistor 111 through the inductor 231. A base of the transistor 111 is connected to the bias circuit 211 through the resistance element 241 and is connected to the amplifier 121 through the capacitor 222. An emitter of the transistor 111 is connected to a ground.

A power-supply voltage Vcc3 is supplied to collectors of the transistors 112, 113, and 114 through the respective inductors 232, 233, and 234. Emitters of the transistors 112, 113, and 114 are connected in parallel with the collector of the transistor 111 through the capacitor 221. Bases of the transistors 112, 113, and 114 are connected to the respective bias circuits 212, 213, and 214.

A power-supply voltage Vcc1 is supplied to the amplifier 121. Furthermore, an RF signal RFin is supplied to the amplifier 121. The amplifier 121 amplifies the RF signal RFin and outputs the amplified signal to the base of the transistor 111.

The bias circuits 211, 212, 213, and 214 generate bias currents or voltages and supply the bias currents or voltages to the respective bases of the transistors 111, 112, 113, and 114.

Each of the inductors 231, 232, 233, and 234 is a choke inductor that inhibits coupling of a high-frequency signal to a power supply circuit.

The capacitor 221 is provided so that the transistor 111 is isolated from the transistors 112, 113, and 114 for a direct current and is connected to the transistors 112, 113, and 114 for an alternating current.

One end of the inductor 235 is connected in parallel with the emitters of the transistors 112, 113, and 114. The other end of the inductor 235 is connected to the ground. The inductor 235 is provided so that the emitters of the transistors 112, 113, and 114 are grounded for a direct current. The inductor 235 is set to have a high characteristic impedance so that the emitters of the transistors 112, 113, and 114 are connected to the collector of the transistor 111 for an alternating current.

The matching networks 31, 32, and 33 are connected to the respective collectors of the transistors 112, 113, and 114. Each of the matching networks 31, 32, and 33 is provided to achieve impedance matching between circuits. Each of the matching networks 31, 32, and 33 is constituted, for example, by an inductor and/or a capacitor. The matching networks 31, 32, and 33 can output respective amplified signals RFout1, RFout2, and RFout3.

Operation performed when the RF signal RFin is inputted to the amplifier circuit will be described. The RF signal RFin is supplied to the amplifier 121. The RF signal RFin is amplified by the amplifier 121 and is supplied to the base of the transistor 111 through the capacitor 222. The RF signal RFin that has been amplified by the amplifier 121 and from which a direct-current (DC) component due to a bias current or voltage has been removed by the capacitor 222 is supplied to the base of the transistor 111. Incidentally, the capacitor 222 has a function of blocking the supply of a bias voltage or bias current of a DC component supplied from the bias circuit 211 to the amplifier 121.

A bias current or voltage is supplied to the base of the transistor 111 (first transistor) by the bias circuit 211. When the bias current or voltage is supplied, the transistor 111 outputs, from the collector thereof, an amplified signal RF1 obtained by amplifying the signal from the amplifier 121. The amplified signal RF1 contains a DC component, which is the bias current or voltage, and an alternating-current (AC) component of the amplified RF signal RFin. The amplified signal RF1 corresponds to a first amplified signal.

The amplified signal RF1 is supplied to the emitters of the transistors 112, 113, and 114 through the capacitor 221. The DC component of the amplified signal RF1 is removed by the capacitor 221. The emitters of the transistors 112, 113, and 114 are grounded through the inductor 235 for a direct current. The emitters of the transistor 112, 113, and 114 are driven by the AC component of the amplified signal RF1 at around a ground potential.

A bias current or voltage is supplied to any one of the bases of the transistors 112, 113, and 114 by the bias circuit 212, 213, or 214.

When a bias current or voltage is supplied to the base of the transistor 112 (second transistor), the transistor 112 outputs, from the collector thereof through the matching network 31, an amplified signal RFout1 obtained by amplifying the AC component of the amplified signal RF1. The amplified signal RFout1 corresponds to a second amplified signal.

When a bias current or voltage is supplied to the base of the transistor 113 (third transistor), the transistor 113 outputs, from the collector thereof through the matching network 32, an amplified signal RFout2 obtained by amplifying the AC component of the amplified signal RF1. The amplified signal RFout2 corresponds to a third amplified signal.

When a bias current or voltage is supplied to the base of the transistor 114, the transistor 114 outputs, from the collector thereof through the matching network 33, an amplified signal RFout3 obtained by amplifying the AC component of the amplified signal RF1.

The transistors 112, 113, and 114 are switched, by the presence or absence of bias currents or voltages from the respective bias circuits 212, 213, and 214, between an on state in which a signal is amplified and an off state in which a signal is not amplified.

The power amplifier circuit 10 operates as described above and thus switches the transistors 112, 113, and 114 between the on state and the off state. When each transistor is switched between the on state and the off state, amplification and switching can be performed in an integrated manner. Hence, the power amplifier circuit 10 can output an amplified RF signal selectively to different output terminals without using any switch.

A second embodiment will be described with reference to FIG. 2. In the second and subsequent embodiments, a description of things in common with the first embodiment is omitted as much as possible, and a description will be given with emphasis on respects in which the second and subsequent embodiments differ from the first embodiment. In particular, similar function effects achieved by similar configurations are not repeatedly described in each embodiment.

Figure 2:
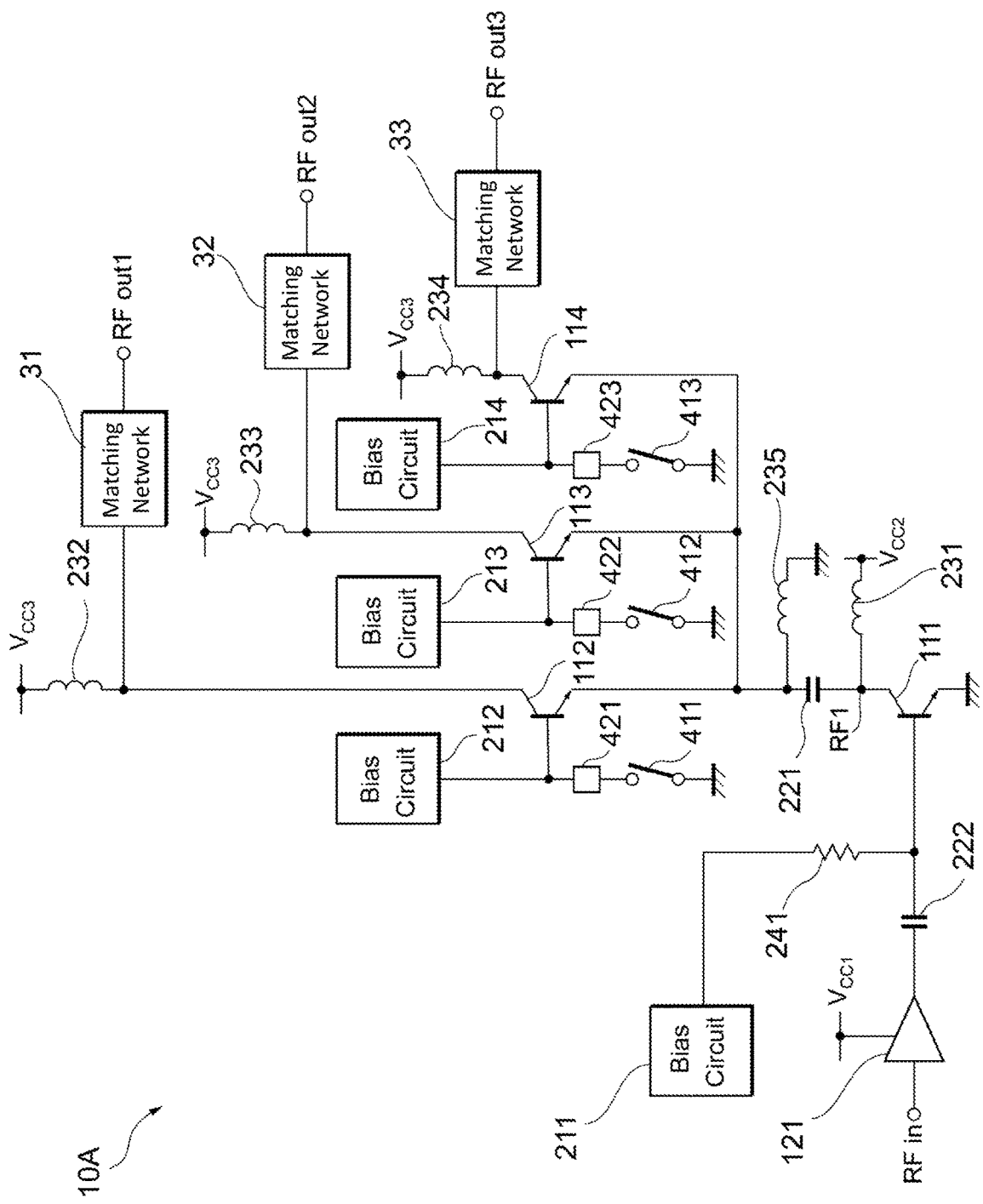
FIG. 2 illustrates an example of a configuration of a power amplifier circuit according to a second embodiment of the present disclosure.

As illustrated in FIG. 2, a power amplifier circuit 10A according to the second embodiment further includes, in the power amplifier circuit 10, switches 411, 412, and 413, and impedance elements 421, 422, and 423.

One ends of the respective switches 411, 412, and 413 are connected to the ground. The impedance elements 421, 422, and 423 are connected in series with the respective other ends of the switches 411, 412, and 413. One ends of the impedance elements 421, 422, and 423 are connected to the respective bases of the transistors 112, 113, and 114.

Each of the impedance elements 421, 422, and 423 is an element configured to have a certain impedance. For example, each of the impedance elements 421, 422, and 423 is constituted by a resistor, an inductor, a composite of a resistor and an inductor, or the like.

With respect to the switches 411, 412, and 413, when a bias current or voltage is supplied to the base of the transistor 112, the switch 411 can be turned off, and the switches 412 and 413 can be turned on. When a bias current or voltage is supplied to the base of the transistor 113, the switch 412 can be turned off, and the switches 411 and 413 can be turned on. When a bias current or voltage is supplied to the base of the transistor 114, the switch 413 can be turned off, and the switches 411 and 412 can be turned on.

When the switches 411, 412, and 413 are switched between on and off states, the bases of the transistors 112, 113, and 114 can be connected to the ground.

The disposition of the impedance elements 421, 422, and 423 may be changed so that the impedance elements 421, 422, and 423 are connected between the switches 411, 412, and 413 and the ground. Even when the disposition is changed in this way, the bases of the transistors 112, 113, and 114 can be connected to the ground by switching each switch between on and off states.

Operation of the power amplifier circuit 10A will be described. In the case where the amplified signal RFout1 is extracted, a bias current or voltage is supplied from the bias circuit 212 to the base of the transistor 112. The switch 411 is turned off, and the switches 412 and 413 are turned on.

Since the switches 412 and 413 are on, base voltages of the transistors 113 and 114 are fixed at a ground voltage. The emitter of the transistor 113 is driven by an AC component of the amplified signal RF1 at around the ground voltage. A base-emitter voltage of the transistor 113 is a voltage obtained by inverting an emitter voltage of the transistor 113. Similarly, a base-emitter voltage of the transistor 114 is a voltage obtained by inverting an emitter voltage of the transistor 114.

When the base of the transistor 113 is fixed at the ground voltage, the base-emitter voltage of the transistor 113 is smaller than that in the case where the base voltage of the transistor 113 is a positive value. The same holds true for the transistor 114 as well, and the base-emitter voltage of the transistor 114 is smaller than that in the case where a base voltage with a positive value is applied. This is because, if the transistors 113 and 114 attempt to reach the on state, a potential drop occurs in the impedance elements 422 and 423.

The base-emitter voltages of the transistors 113 and 114 vary in a range where the transistors 113 and 114 do not output respective unintended amplified signals RFout2 and RFout3.

Since the switch 411 is off, the supply of a bias current or voltage from the bias circuit 212 is not blocked. The transistor 112 outputs, through the matching network 31, the amplified signal RFout1 obtained by amplifying the AC component of the amplified signal RF1.

As in the operation of outputting the amplified signal RFout1, the transistor 113 outputs the amplified signal RFout2, and the transistor 114 outputs the amplified signal RFout3.

As described above, the power amplifier circuit 10A operates to keep each transistor from outputting an unintended amplified signal. Hence, the power amplifier circuit 10A enables an increase in the isolation between the transistors 112, 113, and 114. The power amplifier circuit 10A operates as described above and thus switches the transistors 112, 113, and 114 between the on state and the off state. When each transistor is switched between the on state and the off state, amplification and switching can be performed in an integrated manner. Hence, the power amplifier circuit 10A can output an amplified RF signal selectively to different output terminals without using any switch for band select.

Figure 3:
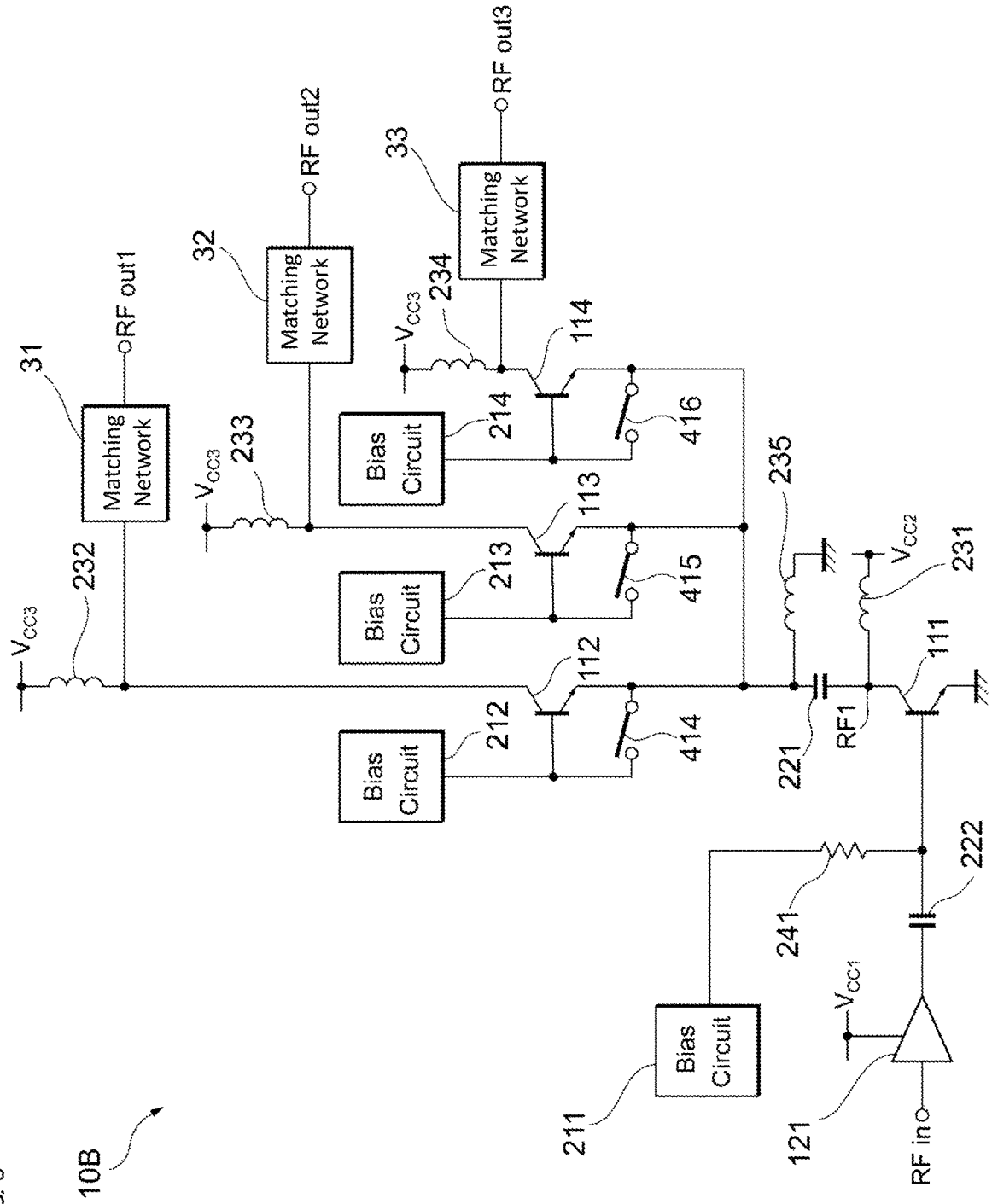
FIG. 3 illustrates an example of a configuration of a power amplifier circuit according to a third embodiment of the present disclosure.

A third embodiment will be described with reference to FIG. 3. In the third embodiment, a description will be given with emphasis on respects in which the third embodiment differs from the first embodiment and the second embodiment. As illustrated in FIG. 3, a power amplifier circuit 10B according to the third embodiment further includes, in the power amplifier circuit 10, switches 414, 415, and 416.

The base and emitter of the transistor 112 are connected to both respective ends of the switch 414. The base and emitter of the transistor 113 are connected to both respective ends of the switch 415. The base and emitter of the transistor 114 are connected to both respective ends of the switch 416.

Switching of each switch between on and off states is performed as in the second embodiment. In the case where any one of the transistors 112, 113, and 114 performs amplification, only a switch is turned off that connects the base and emitter of a transistor that is to perform amplification. The other switches are turned on.

In the case where the amplified signal RFout1 is extracted, the switch 414 is turned off, and the switches 415 and 416 are turned on.

Since the switch 415 is turned on, the base and emitter of the transistor 113 are connected to each other. Since the base and emitter of the transistor 113 are connected to each other, a base-emitter voltage of the transistor 113 is about 0 V.

The same holds true for the transistor 114 as well, and a base-emitter voltage of the transistor 114 is about 0 V.

The base-emitter voltages of the transistors 113 and 114 vary in a range where the transistors 113 and 114 do not output respective unintended amplified signals RFout2 and RFout3 due to the influence of impedances of the switches 415 and 416.

Since the switch 414 is off, the supply of a bias current or voltage from the bias circuit 212 is not blocked. The transistor 112 outputs, through the matching network 31, the amplified signal RFout1 obtained by amplifying an AC component of the amplified signal RF1.

As in the operation of outputting the amplified signal RFout1, the transistor 113 outputs the amplified signal RFout2, and the transistor 114 outputs the amplified signal RFout3.

In the power amplifier circuit 10B as well, a transistor in the off state is kept from malfunctioning, and the isolation between the transistors 112, 113, and 114 can be increased.

Figure 4:
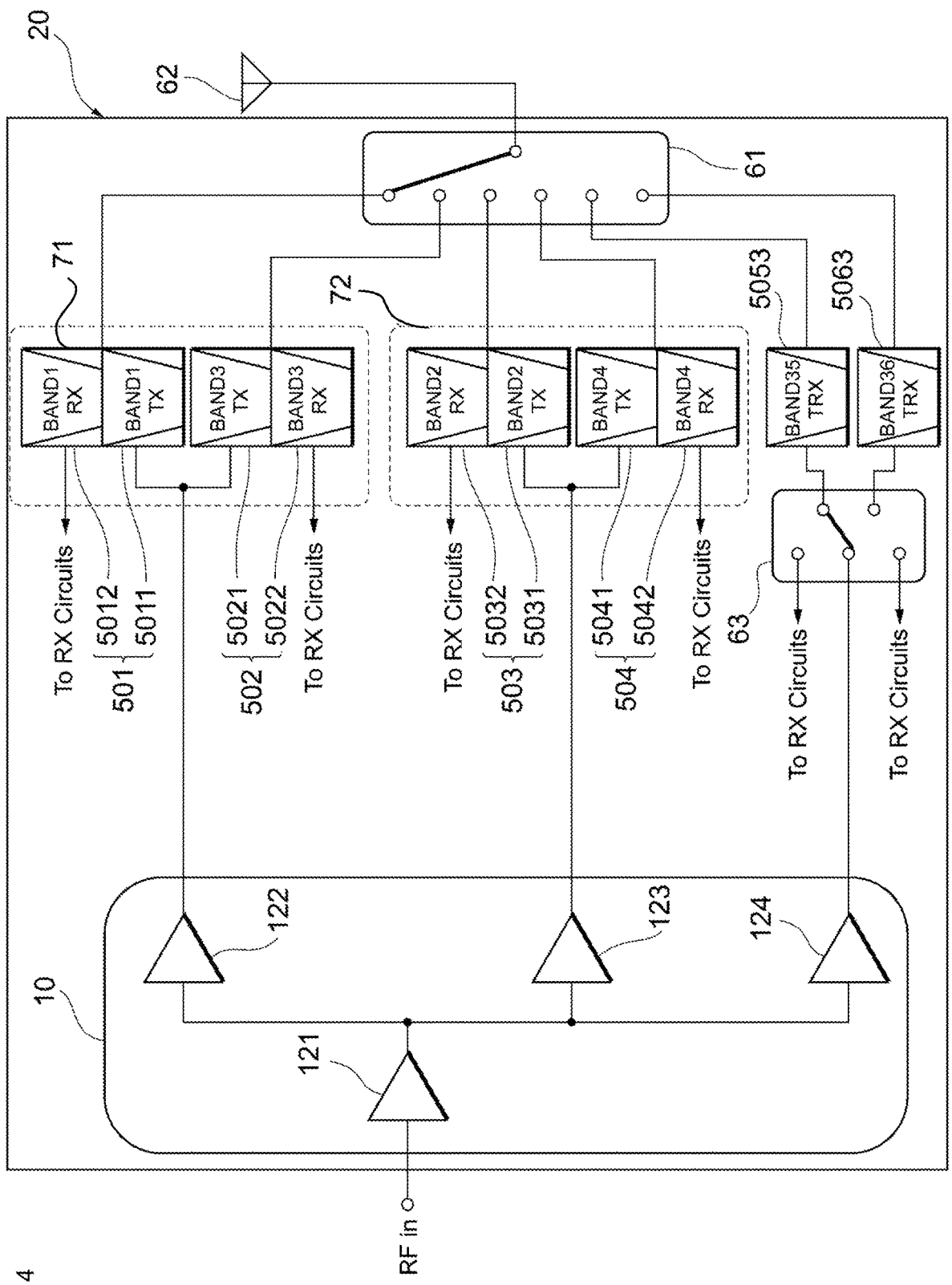
FIG. 4 illustrates an example of a configuration of the power amplifier circuit and a power amplifier module according to a fourth embodiment of the present disclosure.

A fourth embodiment will be described. In the fourth embodiment, a power amplifier module 20 will be described that includes the power amplifier circuit 10. As illustrated in FIG. 4, the power amplifier module 20 includes the power amplifier circuit 10, duplexers 501, 502, 503, and 504, an antenna switch 61, and a transmission-reception switch 63. Incidentally, the power amplifier circuit 10 can be replaced with the power amplifier circuit 10A or 10B.

The power amplifier circuit 10 is the power amplifier circuit described in the first embodiment. In the fourth embodiment, the power amplifier circuit 10 is represented as a circuit including amplifiers 121, 122, 123, and 124. The amplifier 122 performs power amplification using the transistor 111 and the transistor 112 that are illustrated in FIG. 1. The amplifier 123 performs power amplification using the transistor 111 and the transistor 113. The amplifier 124 performs power amplification using the transistor 111 and the transistor 114. Thus, the transistor 111 is shared, and three amplifiers can be implemented by switching the operation of each of the transistors 112, 113, and 114.

The RF signal RFin is inputted to the amplifier 121. Input terminals of the amplifiers 122, 123, and 124 are connected in parallel with the amplifier 121. An output terminal of the amplifier 122 is connected to input terminals of transmission filters 5011 and 5021. An output terminal of the amplifier 123 is connected to input terminals of transmission filters 5031 and 5041. An output terminal of the amplifier 124 is connected to the transmission-reception switch 63.

Each of the transmission filters 5011, 5021, 5031, and 5041 is a band pass filter. The transmission filter 5011 passes a signal having a frequency in a transmission frequency band, for example, of BAND 1 for long term evolution (LTE) communications. The transmission filters 5021, 5031, and 5041 pass signals having frequencies in respective transmission frequency bands, for example, of BAND 3, BAND 2, and BAND 4.

The input terminal of the transmission filter 5011 and the input terminal of the transmission filter 5021 are connected to each other without any switch. The input terminal of the transmission filter 5031 and the input terminal of the transmission filter 5041 are connected to each other without any switch.

Output terminals of the transmission filters 5011, 5021, 5031, and 5041 are connected to the antenna switch 61.

The antenna switch 61 is a switch that switches, in accordance with a frequency band used by the power amplifier module 20, between the connections of an antenna 62 to other circuit portions of the power amplifier module 20.

Each of reception filters 5012, 5022, 5032, and 5042 is a band pass filter. The reception filters 5012, 5022, 5032, and 5042 are connected to the antenna switch 61.

The reception filters 5012, 5022, 5032, and 5042 pass signals having frequencies in respective reception frequency bands, for example, of BAND 1, BAND 3, BAND 2, and BAND 4. Each of the reception filters 5012, 5022, 5032, and 5042 outputs a received frequency signal to reception circuits (RX Circuits).

Transmission filters and reception filters that correspond to respective frequency bands constitute duplexers corresponding to the respective frequency bands. With respect to BAND 1, the transmission filter 5011 and the reception filter 5012 constitute the duplexer 501. Similarly, with respect to BAND 3, BAND 2, and BAND 4 as well, the respective duplexers 502, 503, and 504 are constituted. Furthermore, a common connection is made between an input terminal and an output terminal on an antenna 62 side of each of the duplexers 501, 502, 503, and 504.

The duplexer 501 and the duplexer 502 are regarded as a duplexer block 71. The duplexer 503 and the duplexer 504 are regarded as a duplexer block 72.

Transmission-reception filters 5053 and 5063 are connected to the transmission-reception switch 63. Each of the transmission-reception filters 5053 and 5063 is a band pass filter. The transmission-reception filters 5053 and 5063 are connected to the antenna switch 61. The transmission-reception filters 5053 and 5063 pass respective frequency signals, for example, in BAND 35 and BAND 36, in each of which transmission and reception bands are the same frequency band.

The transmission-reception switch 63 can switch between transmission and reception of a frequency signal in BAND 35 or BAND 36 in accordance with a time interval, for example. The transmission-reception switch 63 can switch between BAND 35 and BAND 36 in accordance with a frequency band that is used.

The transmission-reception filters 5053 and 5063, and the transmission-reception switch 63 enable communications based on a time division duplex (TDD) scheme.

Figure 5:
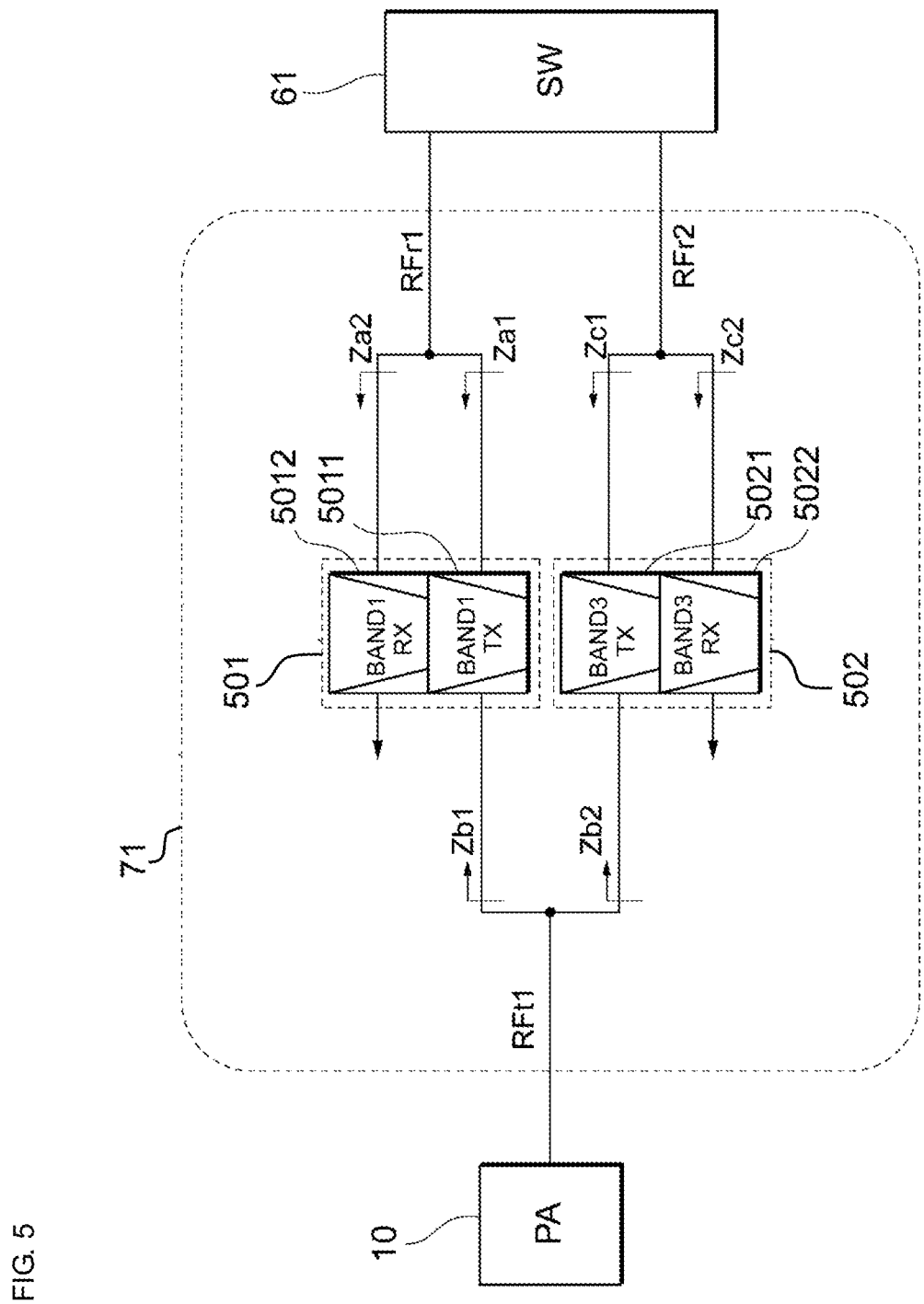
FIG. 5 illustrates an example of a configuration of a duplexer block.

The duplexer block 71 will be described with reference to FIGS. 5, 6, 7A, 7B, and 8. In FIG. 5, the duplexer block 71 constituted by the duplexers 501 and 502 is connected to the power amplifier circuit 10 and the antenna switch 61. The power amplifier circuit 10 and the antenna switch 61 are illustrated in a simplified manner.

An impedance Za1 is an output impedance of the output terminal of the transmission filter 5011 as seen from the antenna switch 61. An impedance Za2 is an input impedance of an input terminal of the reception filter 5012 as seen from the antenna switch 61.

An impedance Zb1 is an input impedance of the input terminal of the transmission filter 5011 as seen from the power amplifier circuit 10. An impedance Zb2 is an input impedance of the input terminal of the transmission filter 5021 as seen from the power amplifier circuit 10.

An impedance Zc1 is an output impedance of the output terminal of the transmission filter 5021 as seen from the antenna switch 61. An impedance Zc2 is an input impedance of an input terminal of the reception filter 5022 as seen from the antenna switch 61.

Figure 6:
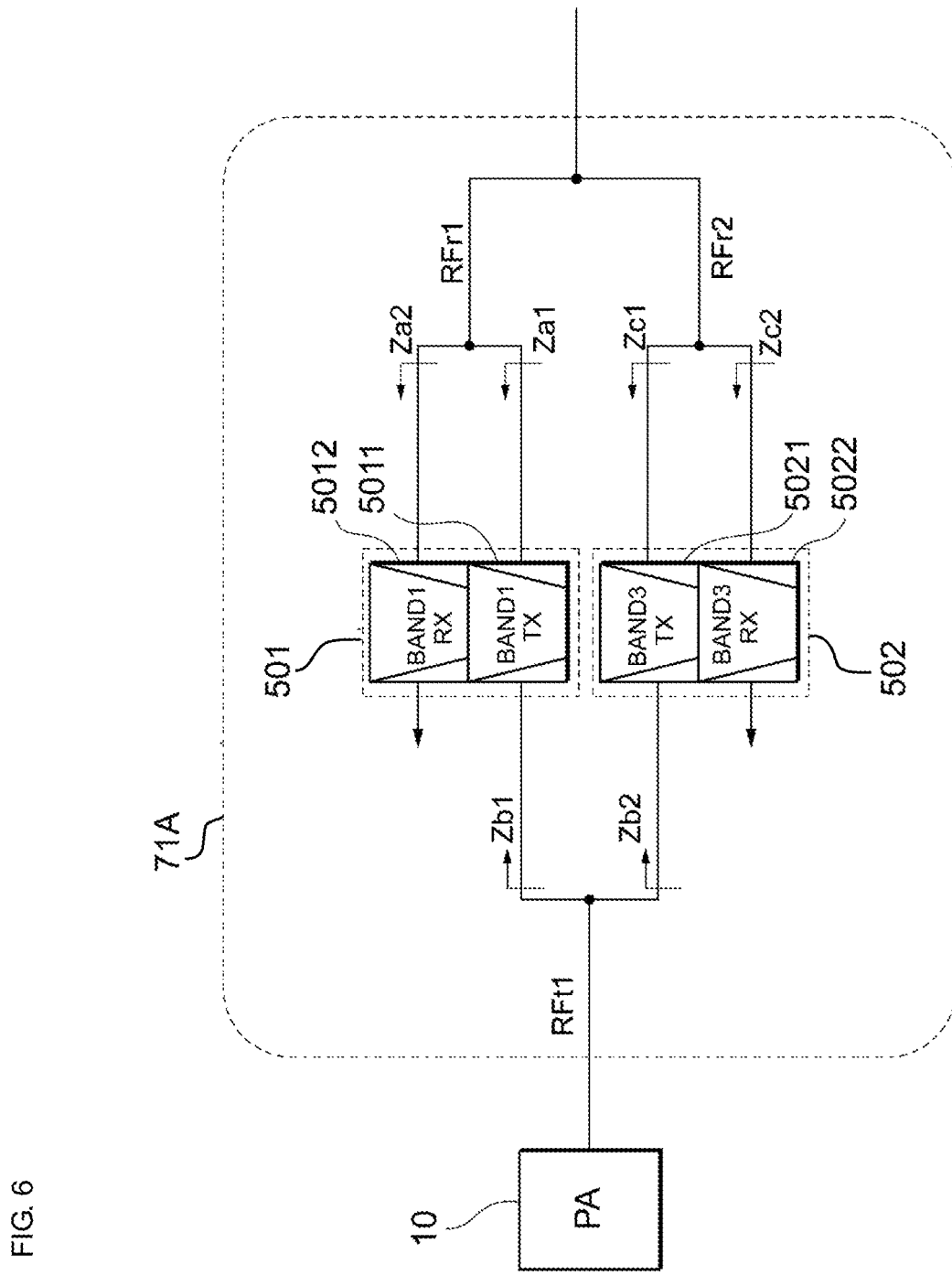
FIG. 6 illustrates an example of a configuration in which a quadplexer structure is constructed in FIG. 5.

Also, FIG. 6 illustrates an example of a quadplexer 71A in which a switch connection is made on an antenna side of the duplexers 501 and 502. The quadplexer 71A operates in a manner similar to a circuit illustrated in FIG. 5 as described later. In this case, no switch is used that switches between the connections of the respective duplexers 501 and 502 that respectively correspond to BAND 1 and BAND 3.

Figure 7A:
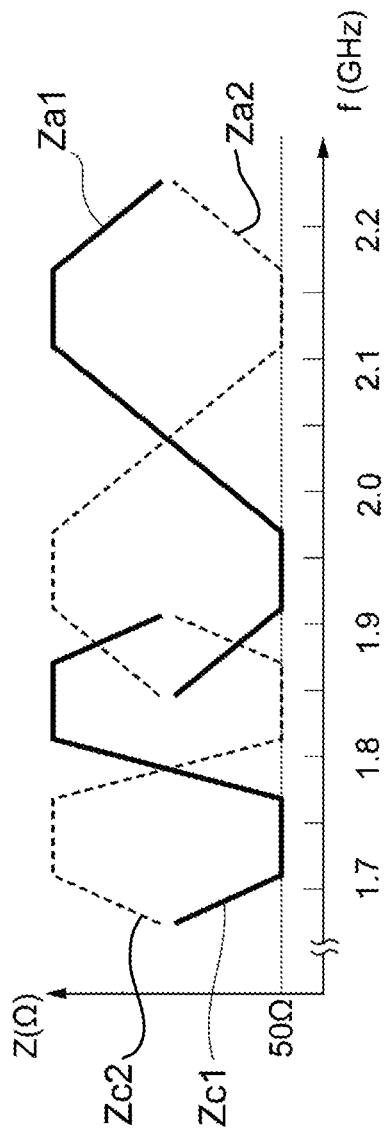
FIG. 7A illustrates input impedances of duplexers as seen from an antenna switch.
Figure 7B:
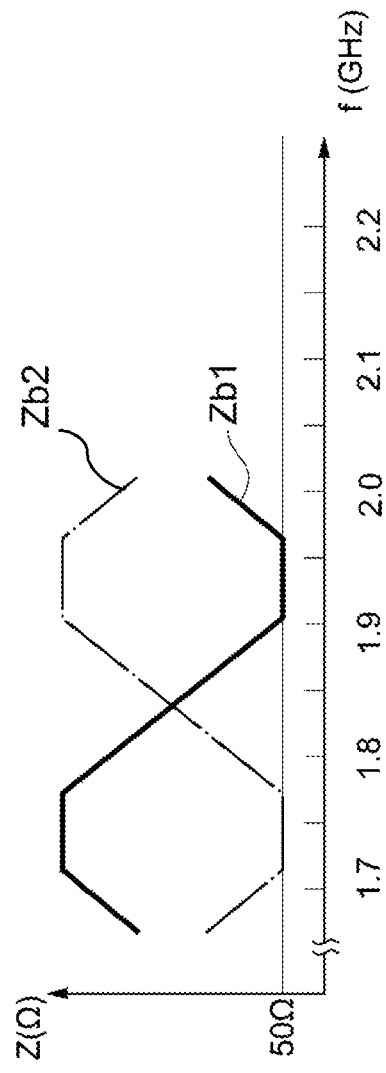
FIG. 7B illustrates input impedances of the duplexers as seen from the power amplifier circuit.

In this embodiment and subsequent embodiments, a description will be given assuming that impedance is matched at about 50Ω. FIGS. 7A and 7B are graphs illustrating a relationship between frequency and impedance. In each graph, the horizontal axis represents signal frequency [GHz], and the vertical axis represents impedance [Ω].

FIG. 8 is a table illustrating an LTE band configuration in a 2 GHz band. An item "BAND Numbers" corresponds to a frequency band, such as BAND 1 or BAND 3. An item "Up LINK" corresponds to a transmission frequency band. In the table, "fmin" and "fmax" respectively correspond to a minimum frequency and a maximum frequency in each frequency band. An item "Down LINK" corresponds to a reception frequency band. Frequency is expressed in MHz.

In FIG. 7A, the impedances Za1, Za2, Zc1, and Zc2 are represented. In FIG. 7B, the impedances Zb1 and Zb2 are represented.

The impedance Za1 reaches about 50Ω in a transmission frequency band of BAND 1. The impedance Zc1 reaches about 50Ω in a transmission frequency band of BAND 3.

The impedance Zb1 reaches about 50Ω in the transmission frequency band of BAND 1. The impedance Zb2 reaches about 50Ω in the transmission frequency band of BAND 3.

The impedance Za2 reaches about 50Ω in a reception frequency band of BAND 1. The impedance Zc2 reaches about 50 Ω in a reception frequency band of BAND 3.

The impedance Za1 reaches a value sufficiently higher than the impedance Za2 in the reception frequency band of BAND 1. The impedance Za2 reaches a value sufficiently higher than the impedance Za1 in the transmission frequency band of BAND 1. A sufficiently high value herein is a value about ten or more times higher than a 50Ω matching condition, for example.

The impedance Zb1 reaches a value higher than the impedance Zb2 in the transmission frequency band of BAND 3. The impedance Zb2 reaches a value sufficiently higher than the impedance Zb1 in the transmission frequency band of BAND 1.

The impedance Zc1 reaches a value higher than the impedance Zc2 in the reception frequency band of BAND 3. The impedance Zc2 reaches a value sufficiently higher than the impedance Zc1 in the transmission frequency band of BAND 3.

A value of each impedance only need to behave as described above in each frequency band. Outside each frequency band, an impedance value to be reached can be appropriately changed.

Operation of the duplexer block 71 will be described. Assume that an RF signal RFr1 or RFr2 is inputted from the antenna switch 61 to the duplexer block 71. The RF signals RFr1 and RFr2 have frequencies in the respective reception frequency bands of BAND 1 and BAND 3.

When the RF signal RFr1 is received, the antenna switch 61 supplies the RF signal RFr1 to the duplexer 501. With respect to impedance in the frequency band of the RF signal RFr1, the impedance Za2 is about 50Ω, and the impedance Za1 is a value higher than the impedance Za2. Thus, the RF signal RFr1 is supplied to mainly the reception filter 5012 in which impedance has been matched.

Assume that an amplified signal RFt1 is inputted from the power amplifier circuit 10 to the duplexer block 71. If a frequency band of the amplified signal RFt1 is BAND 1, the amplified signal RFt1 has a frequency in the transmission frequency band of BAND 1.

The power amplifier circuit 10 attempts to supply the amplified signal RFt1 to the transmission filters 5011 and 5021. With respect to impedance in the frequency band of the amplified signal RFt1, the impedance Zb1 is about 50Ω, and the impedance Zb2 is a value higher than the impedance Zb1. Thus, the amplified signal RFt1 is supplied to mainly the transmission filter 5011 in which impedance has been matched. Furthermore, the impedance Za1 is about 50Ω, and the impedance Za2 is higher than the impedance Za1. Thus, the amplified signal RFt1 having passed through the transmission filter 5011 is kept from leaking into the reception filter 5012. The amplified signal RFt1 is supplied from the transmission filter 5011 to the antenna switch 61.

When the RF signal RFr2 is received, the antenna switch 61 supplies the RF signal RFr2 to the duplexer 502. As in the case of BAND 1, the RF signal RFr2 is supplied to the reception filter 5022 in which impedance has been matched.

If the frequency band of the amplified signal RFt1 is BAND 3, the amplified signal RFt1 is attempted to be supplied from the power amplifier circuit 10 to the transmission filters 5011 and 5021. As in the case of BAND 1, the amplified signal RFt1 is supplied to mainly the transmission filter 5021 in which impedance has been matched. The amplified signal RFt1 that has been supplied is supplied from the transmission filter 5021 to the antenna switch 61.

The duplexer block 71 includes the transmission filters 5011 and 5021 whose impedances differ from frequency band to frequency band for BAND 1 and BAND 3. In the duplexer block 71, impedance differs between transmission filters, and thus amplified signals having frequencies in multiple frequency bands can be supplied to filters suitable for the respective frequency bands.

In the power amplifier module 20 according to this embodiment, transmission filters of a pair of duplexers are connected without any switch. An amplified signal is switched in accordance with a frequency band without using any switch. No switch for switching an amplified signal is used between the duplexers 501, 502, 503, and 504 and the power amplifier circuit 10, thus enabling a reduction in loss due to a switch.

As a factor of loss in the duplexer 501 in which a common connection is made between the input and output terminals on the antenna 62 side, there is power that leaks into filters paired with each other.

In the duplexer block 71 as well, as filters paired with each other, there are the transmission filters 5011 and 5021. With respect to a pair of the transmission filter 5011 and the reception filter 5012 that are included in the duplexer 501, and a pair of the transmission filter 5011 and the transmission filter 5021 that are included in the duplexer block 71, a difference between losses will be described.

A frequency interval between the transmission frequency band and reception frequency band of BAND 1 is found to be about 130 MHz as a difference between a maximum value of the transmission frequency band and a minimum value of the reception frequency band from the table illustrated in FIG. 8. Similarly, a frequency interval between the transmission frequency band and reception frequency band of BAND 3 is found to be about 20 MHz.

A frequency interval between the transmission frequency band of BAND 1 and the transmission frequency band of BAND 3 is found to be about 135 MHz as a difference between a minimum value of the transmission frequency band of BAND 1 and a maximum value of the transmission frequency band of BAND 3.

The transmission frequency interval between BAND 1 and BAND 3 is larger than each of the frequency intervals between the transmission frequency bands and reception frequency bands of BAND 1 and BAND 3.

It can be made easier to increase an impedance in a frequency band that is not used as the frequency interval increases. Thus, impedances from the power amplifier circuit 10 toward the duplexer block 71 can be easily made higher than impedances of common input-output terminals on the antenna 62 side of the duplexers 501 and 502. An impedance setting can be set under more relaxed conditions, and thus a difference between impedances from the power amplifier circuit 10 toward the duplexer block 71 can be made large.

When a difference between impedances increases, power that leaks into filters paired with each other decreases. Thus, a loss caused by the supply of a signal from the power amplifier circuit 10 to the duplexer 501 can be made less than a loss caused by the impedance of the common input-output terminal included in the duplexer 501.

In the fourth embodiment, although the power amplifier circuit 10 includes three outputs, the number of outputs is not limited to three. As the number of output terminals increases or decreases, the number of duplexer blocks can be increased or reduced. For example, when the number of duplexer blocks 71 is adjusted as the duplexer block 72 is added, the number of frequency bands supported by the power amplifier module 20 can be increased or reduced.

Furthermore, with respect to switching of an amplified signal by the duplexer block 71 according to the fourth embodiment, any multi-output power amplifier circuit including multiple outputs that are selectively enabled can be used in this embodiment.

Figure 9:
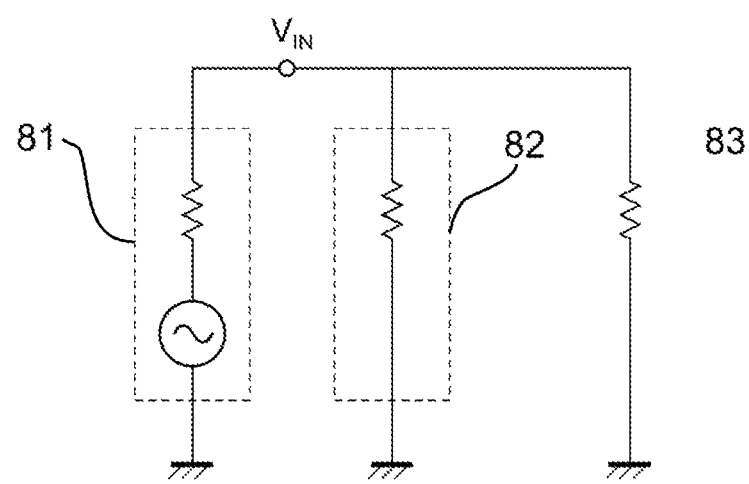
FIG. 9 is a circuit diagram used in simulations of loss caused by a common connection made between transmission filters on a power amplifier side of the duplexer block, in particular, in the power amplifier module.
Figure 10:
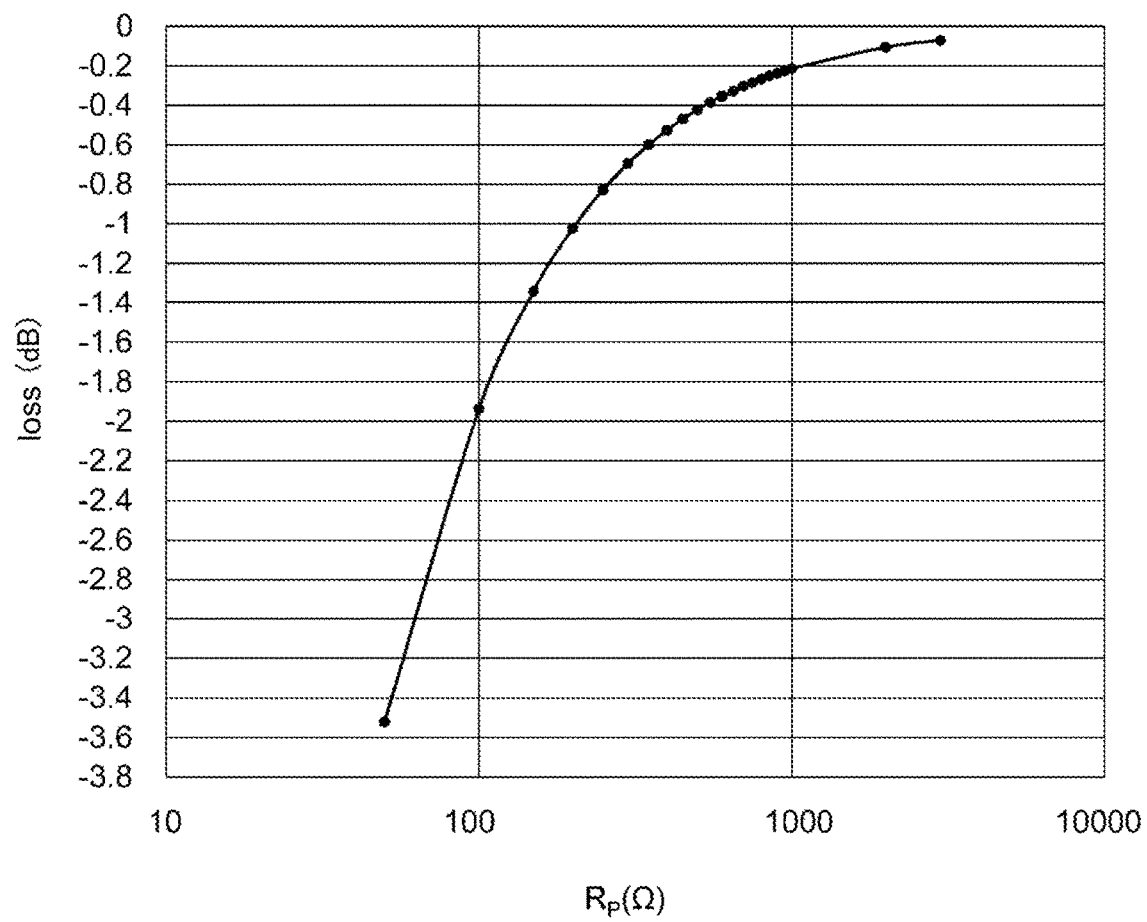
FIG. 10 illustrates the simulation results of loss in a circuit illustrated in FIG. 9.

Among multiple transmission filters to which the same output is supplied, even if an amplified signal passes through mainly a certain transmission filter, there is a signal that passes through another filter. With reference to FIGS. 9 and 10, the influence of insertion loss due to an input impedance of a filter through which few amplified signals pass will be described.

As illustrated in FIG. 9, the case is considered where power is supplied from a signal source 81 of about 50Ω to a load 83 of about 50Ω. A loss caused in the case where, as an impedance of a filter that is not being used, a resistance 82 is connected in parallel is calculated by simulation.

FIG. 10 illustrates the simulation results. The vertical axis represents loss [dB] of power. The horizontal axis represents impedance Rp [Ω] of the resistance 82 at log scale. From these results, an impedance that causes insertion loss can be estimated in accordance with a preset value of loss. For example, to set the loss to about −0.4 dB or less, the impedance Rp only need to be about 530Ω or more.

Incidentally, there is a point to note about a connection of certain transmission filters paired with each other without any switch. Except in the case where a signal is passed through one filter for transmission serving as a common filter, BANDs whose transmission bands are away from each other are to be combined. For example, in the case of BANDs 66 and 70 illustrated in FIG. 8, their transmission bands are adjacent to each other at about 1710 MHz. Since the transmission bands are adjacent to each other, it is difficult to increase an impedance in a frequency band that is not used.

A fifth embodiment will be described. In the fifth embodiment, a description will be given with emphasis on respects in which the fifth embodiment differs from the fourth embodiment. In the fifth embodiment, as illustrated in FIG. 11, a power amplifier module 20A will be described that includes a power amplifier circuit 10C.

Figure 11:
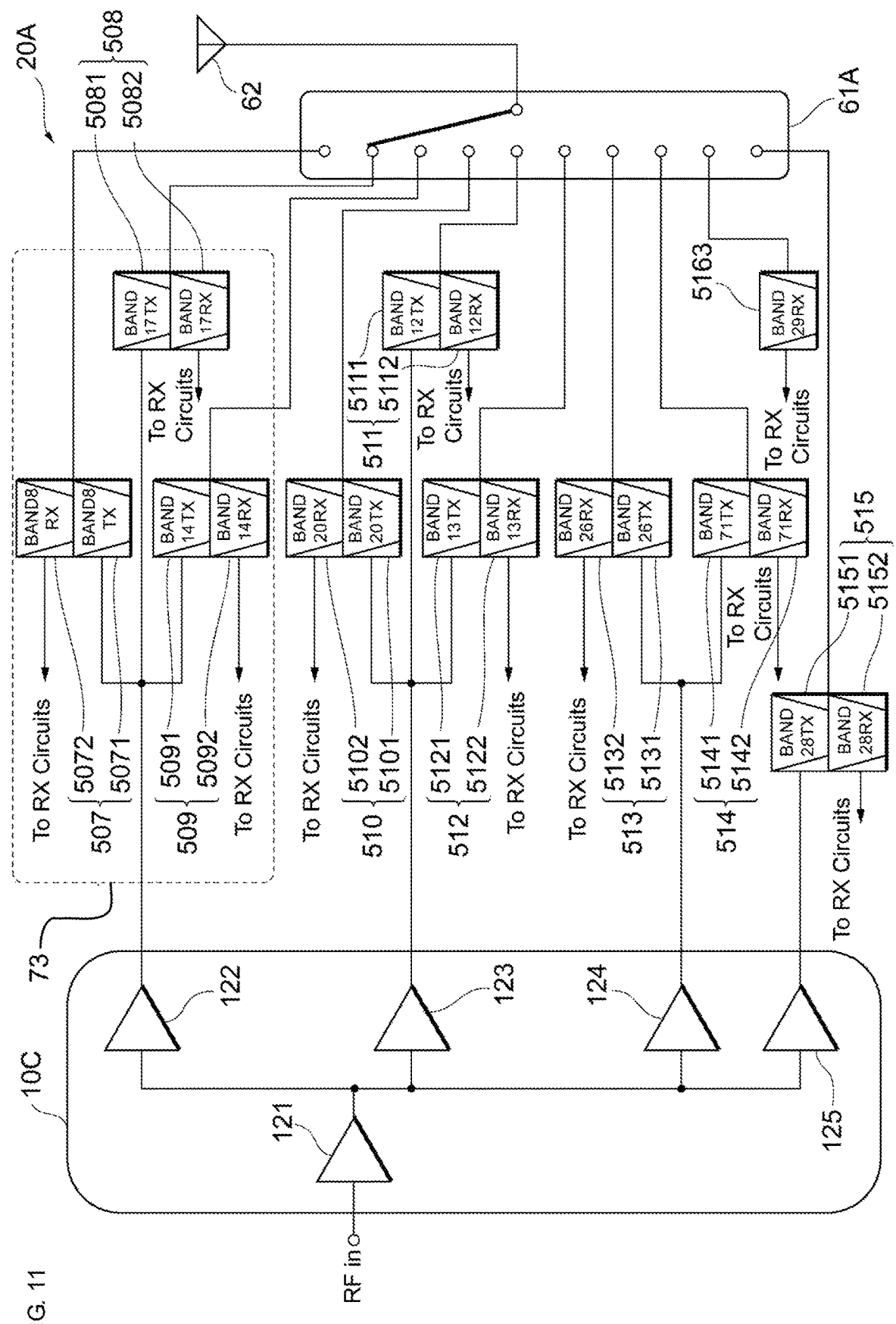
FIG. 11 illustrates an example of a configuration of a power amplifier circuit and a power amplifier module according to a fifth embodiment of the present disclosure.

As illustrated in FIG. 11, the power amplifier module 20A includes the power amplifier circuit 10C, duplexers 507, 508, 509, 510, 511, 512, 513, 514 and 515, and an antenna switch 61A and is connected to the antenna 62.

In the fifth embodiment, the power amplifier circuit 10C further includes, in the power amplifier circuit 10, an amplifier 125. Like the amplifiers 122, 123, and 124, the amplifier 125 is configured.

Input terminals of the amplifiers 122, 123, 124, and 125 are connected in parallel with the amplifier 121. The output terminal of the amplifier 122 is connected to input terminals of transmission filters 5071, 5081, and 5091. The output terminal of the amplifier 123 is connected to input terminals of transmission filters 5101, 5111, and 5121. The output terminal of the amplifier 124 is connected to input terminals of transmission filters 5131 and 5141. An output terminal of the amplifier 125 is connected to an input terminal of a transmission filter 5151.

Each of the transmission filters 5071, 5081, 5091, 5101, 5111, 5121, 5131, 5141, and 5151 is a band pass filter. The transmission filter 5071 passes a signal having a frequency in a transmission frequency band of BAND 8 for LTE communications.

The transmission filters 5081, 5091, 5101, 5111, 5121, 5131, 5141, and 5151 pass signals having frequencies in respective transmission frequency bands of BAND 17, BAND 14, BAND 20, BAND 12, BAND 13, BAND 26, BAND 71, and BAND 28.

The input terminals of the transmission filters 5071, 5081, and 5091 are connected to one another without any switch. The input terminals of the transmission filters 5101, 5111, and 5121 are connected to one another without any switch. The input terminals of the transmission filters 5131 and 5141 are connected to each other without any switch.

An output terminal of each transmission filter is connected to the antenna switch 61A.

Each of reception filters 5072, 5082, 5092, 5102, 5112, 5122, 5132, 5142, and 5152 is a band pass filter. Each reception filter is connected to the antenna switch 61A.

The reception filters 5072, 5082, 5092, 5102, 5112, 5122, 5132, 5142, and 5152 pass signals having frequencies in respective reception frequency bands of BAND 8, BAND 17, BAND 14, BAND 20, BAND 12, BAND 13, BAND 26, BAND 71 and BAND 28.

Each of the reception filters 5072, 5082, 5092, 5102, 5112, 5122, 5132, 5142, and 5152 outputs a received frequency signal to reception circuits (RX Circuits).

Transmission filters and reception filters that correspond to respective frequency bands constitute duplexers corresponding to the respective frequency bands. With respect to BAND 8, the transmission filter 5071 and the reception filter 5072 constitute the duplexer 507.

Similarly, with respect to BAND 17, BAND 14, BAND 20, BAND 12, BAND 13, BAND 26, BAND 71, and BAND 28 as well, the respective duplexers 508, 509, 510, 511, 512, 513, 514, and 515 are constituted.

A common connection is made between an input terminal and an output terminal on the antenna 62 side of each duplexer.

The duplexers 507, 508, and 509 are regarded as a duplexer block 73.

A reception filter 5163 is connected to the antenna switch 61A. The reception filter 5163 is a band pass filter. The reception filter 5163 passes a frequency signal in BAND 29, which is a frequency band dedicated to reception.

Figure 12:
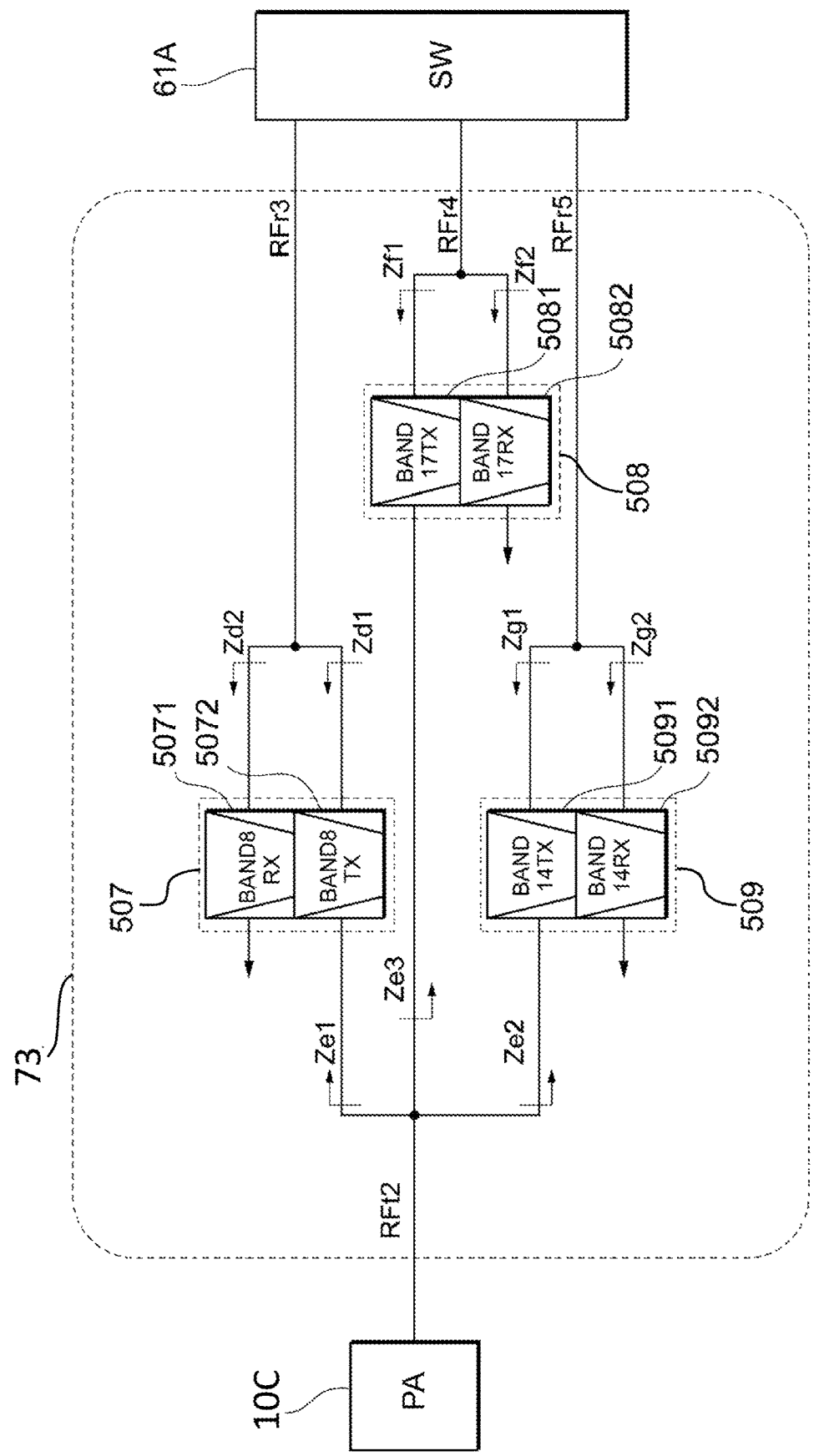
FIG. 12 illustrates an example of a configuration of a duplexer block.

The duplexer block 73 will be described with reference to FIGS. 12, 13A, 13B, and 14. In FIG. 12, the duplexer block 73 constituted by the duplexers 507, 508, and 509 is connected to the power amplifier circuit 10C and the antenna switch 61A. The power amplifier circuit 10C and the antenna switch 61A are illustrated in a simplified manner.

An impedance Zd1 is an output impedance of an output terminal of the transmission filter 5071 as seen from the antenna switch 61A. An impedance Zd2 is an input impedance of an input terminal of the reception filter 5072 as seen from the antenna switch 61A.

An impedance Ze1 is an input impedance of the input terminal of the transmission filter 5071 as seen from the power amplifier circuit 10C. An impedance Ze2 is an input impedance of the input terminal of the transmission filter 5081 as seen from the power amplifier circuit 10C. An impedance Ze3 is an input impedance of the input terminal of the transmission filter 5091 as seen from the power amplifier circuit 10C.

An impedance Zf1 is an output impedance of an output terminal of the transmission filter 5081 as seen from the antenna switch 61A. An impedance Zf2 is an input impedance of an input terminal of the reception filter 5082 as seen from the antenna switch 61A.

An impedance Zg1 is an output impedance of an output terminal of the transmission filter 5091 as seen from the antenna switch 61A. An impedance Zg2 is an input impedance of an input terminal of the reception filter 5092 as seen from the antenna switch 61A.

FIGS. 13A and 13B are graphs illustrating a relationship between frequency and impedance. In each graph, the horizontal axis represents signal frequency [GHz], and the vertical axis represents impedance [Ω].

FIG. 14 is a table illustrating an LTE band configuration in a 1 GHz band. A correspondence relationship in each item is the same as that in the fourth embodiment.

In FIG. 13A, the impedances Zd1, Zd2, Zf1, Zf2, Zg1, and Zg2 are represented. In FIG. 13B, the impedances Ze1, Ze2, and Ze3 are represented.

The impedances Zd1, Zf1, and Zg1 reach about 50Ω in respective transmission frequency bands of BAND 8, BAND 17, and BAND 14.

The impedances Ze1, Ze2, and Ze3 reach about 50Ω in the respective transmission frequency bands of BAND 8, BAND 17, and BAND 14.

The impedances Zd2, Zf2, and Zg2 reach about 50Ω in respective reception frequency bands of BAND 8 BAND 17, and BAND 14.

The impedance Zd1 reaches a value higher than the impedance Zd2 in the reception frequency band of BAND 8. The impedance Zd2 reaches a value higher than the impedance Zd1 in the transmission frequency band of BAND 8.

The impedance Zf1 reaches a value higher than the impedance Zf2 in the reception frequency band of BAND 17. The impedance Zf2 reaches a value higher than the impedance Zf1 in the transmission frequency band of BAND 17.

The impedance Zg1 reaches a value higher than the impedance Zg2 in the reception frequency band of BAND 14. The impedance Zg2 reaches a value higher than the impedance Zg1 in the transmission frequency band of BAND 14.

The impedances Ze1 and Ze2 reach a value higher than the impedance Ze3 in the transmission frequency band of BAND 14. The impedances Ze1 and Ze3 reach a value higher than the impedance Ze2 in the transmission frequency band of BAND 17. The impedances Ze2 and Ze3 reach a value higher than the impedance Ze1 in the transmission frequency band of BAND 8.

A value of each impedance only need to behave as described above in each frequency band. Outside each frequency band, an impedance value to be reached can be appropriately changed.

Operation of the duplexer block 73 will be described. Assume that an RF signal RFr3, RFr4, or RFr5 is inputted from the antenna switch 61A to the duplexer block 73. The RF signals RFr3, RFr4, and RFr5 have frequencies in the respective reception frequency bands of BAND 8, BAND 17, and BAND 14.

When a received signal is the RF signal RFr3, the antenna switch 61A supplies the RF signal RFr3 to the duplexer 507. With respect to impedance in the frequency band of the RF signal RFr3, the impedance Zd2 is about 50Ω, and the impedance Zd1 is a value higher than the impedance Zd2. Thus, the RF signal RFr3 is supplied to mainly the reception filter 5072 in which impedance has been matched.

When the frequency band of the RF signal RFr4 is BAND 17, as in the case of BAND 8, the RF signal RFr4 is supplied to the reception filter 5082 in which impedance has been matched.

When the frequency band of the RF signal RFr5 is BAND 14, as in the case of BAND 8, the RF signal RFr5 is supplied to the reception filter 5092 in which impedance has been matched.

Assume that an amplified signal RFt2 is inputted from the power amplifier circuit 10C to the duplexer block 73. If a frequency band of the amplified signal RFt2 is BAND 8, the amplified signal RFt2 has a frequency in the transmission frequency band of BAND 8.

The power amplifier circuit 10C attempts to supply the amplified signal RFt2 to the transmission filters 5071, 5081, and 5091. With respect to impedance in the frequency band of the amplified signal RFt2, the impedance Ze1 is about 50Ω, and the impedances Ze2 and Ze3 are a value higher than the impedance Ze1. Thus, the amplified signal RFt2 is supplied to mainly the transmission filter 5071 in which impedance has been matched. Furthermore, the impedance Zd1 is about 50Ω, and the impedance Zd2 is higher than the impedance Zd1. Thus, the amplified signal RFt2 having passed through the transmission filter 5071 is kept from leaking into the reception filter 5072. The amplified signal RFt2 is supplied from the transmission filter 5071 to the antenna switch 61A.

As in the case of BAND 8, if the frequency band of the amplified signal RFt2 is BAND 17, the amplified signal RFt2 is supplied to mainly the transmission filter 5081, and if the frequency band of the amplified signal RFt2 is BAND 14, the amplified signal RFt2 is supplied to mainly the transmission filter 5091. The supplied amplified signal RFt2 is supplied to the antenna switch 61A.

The duplexer block 73 includes the transmission filters 5071, 5081, and 5091 whose impedances differ from frequency band to frequency band for BAND 8, BAND 17, and BAND 14. Impedance differs between transmission filters, and thus, if amplified signals having frequencies in multiple frequency bands are output, the amplified signals can be passed through filters suitable for the respective frequency bands.

Like the power amplifier module 20, the power amplifier module 20A according to the fifth embodiment does not have to use any switch for switching an amplified signal, thus enabling a reduction in loss due to a switch.

Furthermore, a frequency interval between the transmission frequency band and reception frequency band of BAND 8 and a frequency interval between the transmission frequency band and reception frequency band of BAND 17 are respectively found to be about 10 MHz and about 18 MHz as a difference between a maximum value of each transmission frequency band and a minimum value of each reception frequency band from the table illustrated in FIG. 14. Furthermore, a frequency interval between the transmission frequency band and reception frequency band of BAND 14 is found to be about 20 MHz as a difference between a minimum value of the transmission frequency band and a maximum value of the reception frequency band.

A frequency interval between the transmission frequency band of BAND 8 and the transmission frequency band of BAND 17 is found to be about 164 MHz as a difference between a minimum value of the transmission frequency band of BAND 8 and a maximum value of the transmission frequency band of BAND 17. A frequency interval between the transmission frequency band of BAND 14 and the transmission frequency band of BAND 17 is found to be about 72 MHz as a difference between the minimum value of the transmission frequency band of BAND 14 and the maximum value of the transmission frequency band of BAND 17.

As in the power amplifier module 20, impedances from the power amplifier circuit 10C toward the duplexer block 73 can be easily made higher than impedances of common input-output terminals on the antenna 62 side of the duplexers 507, 508, and 509.

Thus, a loss caused by the supply of a signal from the power amplifier circuit 10C to the duplexer 507 can be made less than a loss caused by the impedance of the common input-output terminal included in the duplexer 507.

Furthermore, as in the fourth embodiment, when the number of duplexer blocks 73 is adjusted, the number of frequency bands supported by the power amplifier module 20A can be increased or reduced.

The power amplifier circuit 10C according to the fifth embodiment can be replaced with a power amplifier circuit obtained by increasing the number of outputs of the power amplifier circuit 10A or power amplifier circuit 10B. Furthermore, any multi-output power amplifier circuit including multiple outputs that are selectively enabled can be used in this embodiment.

The embodiments have been described above. Here, a first reference example according to the fourth embodiment, and second and third reference examples according to the fifth embodiment will be described.

Figure 15:
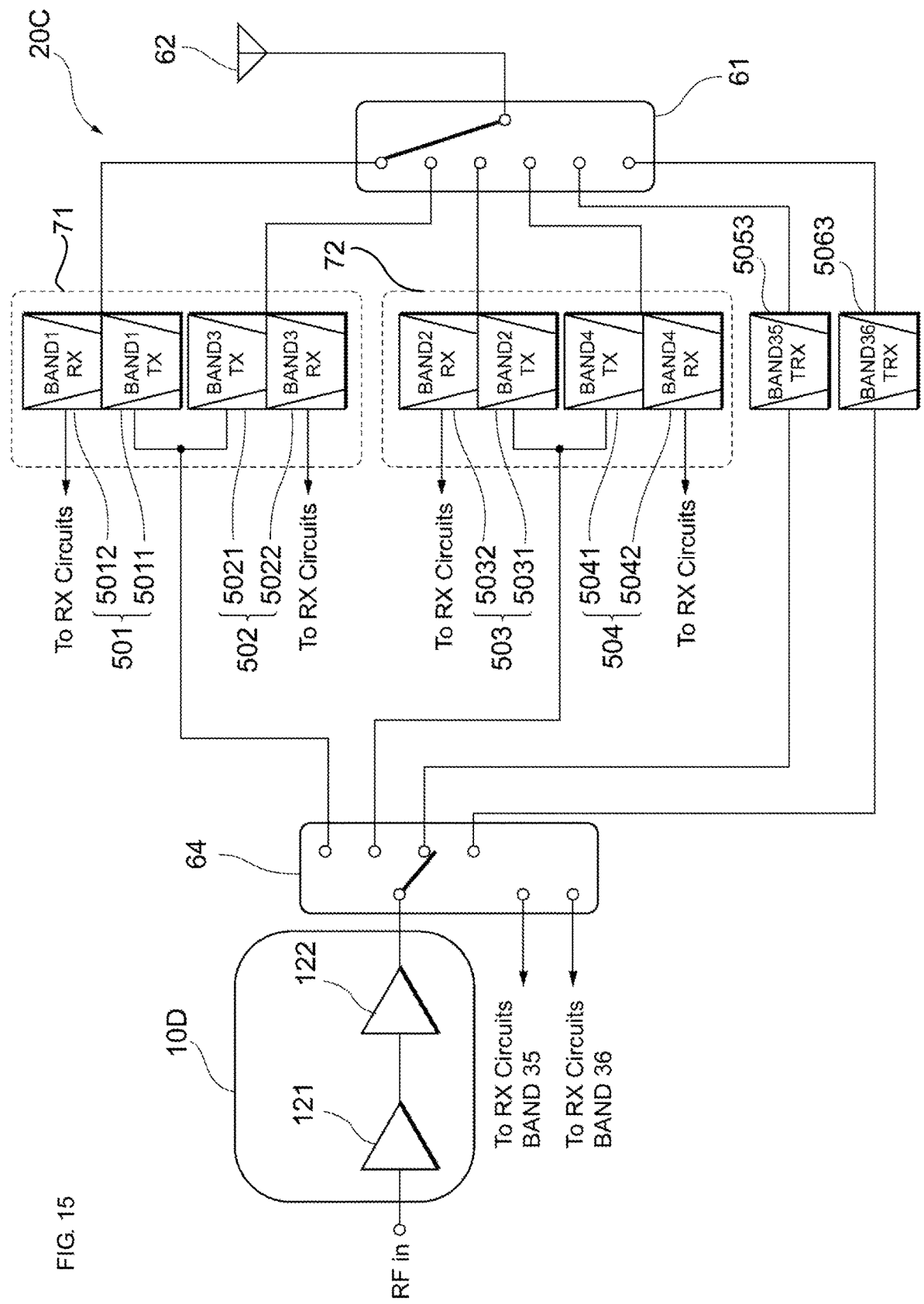
FIG. 15 illustrates a reference example of the power amplifier circuit and the power amplifier module according to the fourth embodiment of the present disclosure.

FIG. 15 illustrates a power amplifier module 20C according to the first reference example. In the power amplifier module 20C, the power amplifier circuit 10 of the power amplifier module 20 is replaced with a power amplifier circuit 10D including a single output. The power amplifier circuit 10D includes the amplifier 121 and the amplifier 122.

When the single output is provided, a switch 64 has to be provided between the power amplifier circuit 10D and each transmission filter. However, two frequency inputs can be separated in frequency band by the duplexer block 71, and thus the number of outputs of the switch 64 can be reduced.

Specifically, in the case where each transmission filter is connected to an individual output, the number of switch outputs has to be six, whereas, in the case of the first reference example, the number of outputs of the switch 64 is reduced to four. A switch circuit can be simplified, thereby enabling a reduction in loss in a switch.

Figure 16:
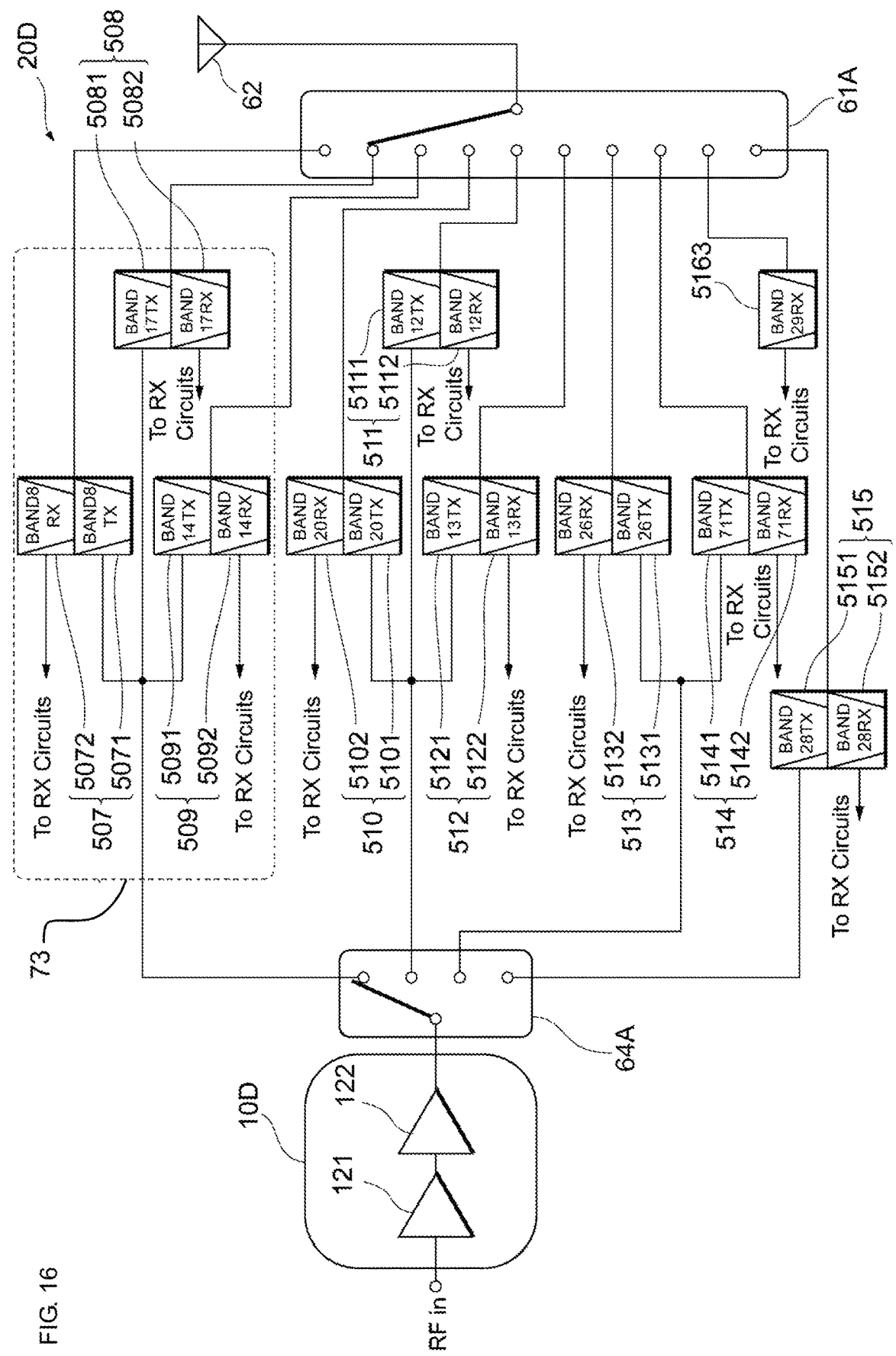
FIG. 16 illustrates a reference example of the power amplifier circuit and the power amplifier module according to the fifth embodiment of the present disclosure.

The second reference example according to the fifth embodiment will be described. FIG. 16 illustrates a power amplifier module 20D according to the second reference example. In the power amplifier module 20D, the power amplifier circuit 10C of the power amplifier module 20A is replaced with the power amplifier circuit 10D including a single output. In this case, as in the first reference example, the number of switch outputs can be reduced from nine to four like a switch 64A. Thus, as in the first reference example, loss in a switch can be reduced.

Figure 17:
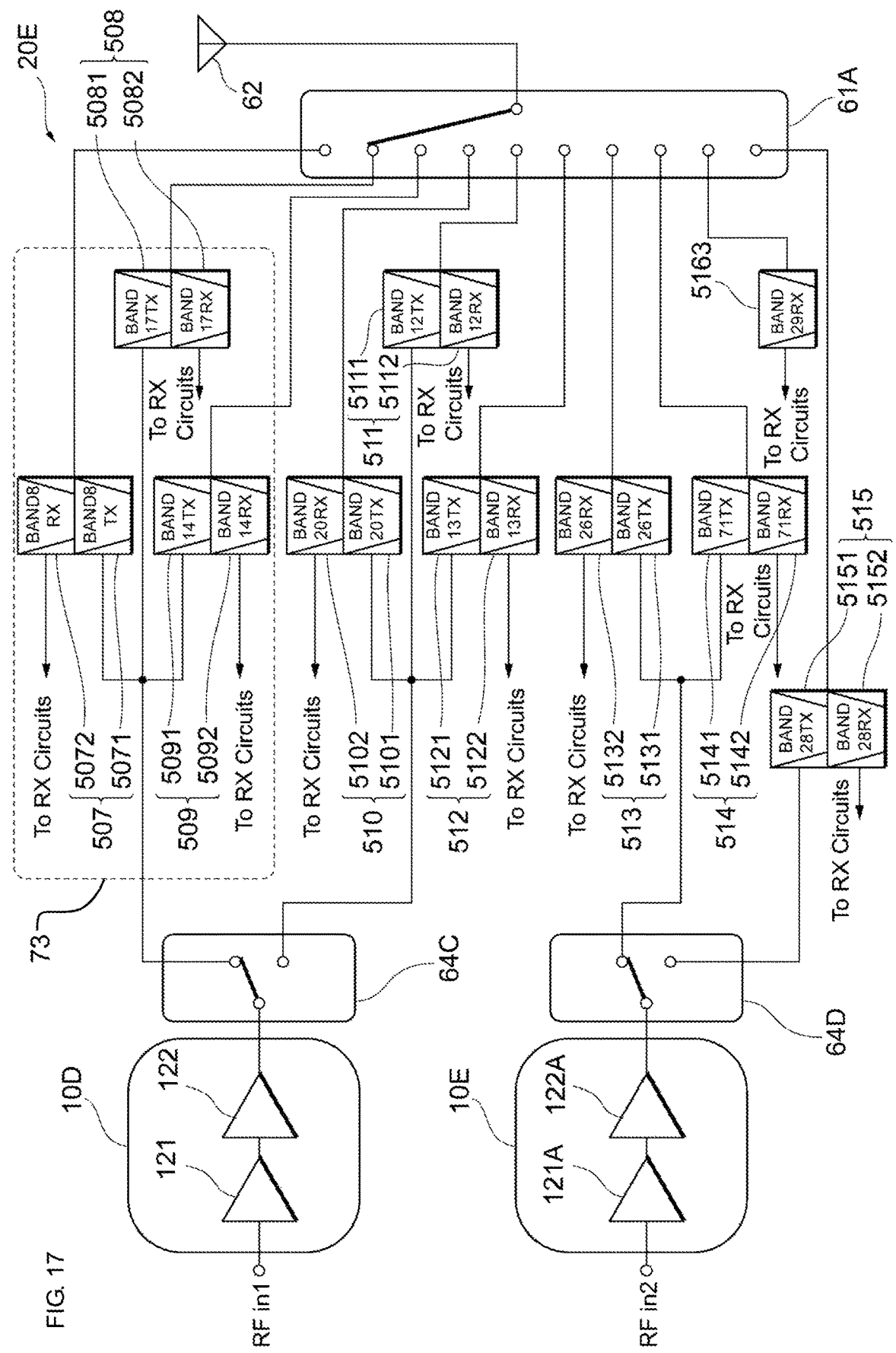
FIG. 17 illustrates a reference example of the power amplifier circuit and the power amplifier module according to the fifth embodiment of the present disclosure.

The third reference example according to the fifth embodiment will be described. FIG. 17 illustrates a power amplifier module 20E according to the third reference example. In the power amplifier module 20E, the power amplifier circuit 10C of the power amplifier module 20A is replaced with power amplifier circuits 10D and 10E including a single output.

The power amplifier circuit 10E includes an amplifier 121A and an amplifier 122A. The power amplifier circuit 10E amplifies power in a manner similar to the power amplifier circuit 10D.

In this case, as in the first reference example, the number of switch outputs can be reduced from nine to four. Furthermore, four outputs are assigned to two switches like switches 64C and 64D, and the number of outputs of each switch can therefore be reduced to two. Thus, as in the second reference example, loss in a switch can be reduced.

The exemplary embodiments of the present disclosure have been described above. The power amplifier circuit 10 according to the first embodiment includes the transistor 111; the bias circuit 211 that supplies a bias current or voltage; the capacitor 221; the inductor 231; the inductor 235; the transistor 112; the bias circuit 212 that supplies a bias current or voltage; the inductor 232; the transistor 113; the bias circuit 213 that supplies a bias current or voltage; and the inductor 233.

The power-supply voltage Vcc2 is supplied to the collector of the transistor 111 through the inductor 231, the emitter of the transistor 111 is grounded, and the RF signal RFin is supplied to the base of the transistor 111.

The power-supply voltage Vcc3 is supplied to the collector of the transistor 112 through the inductor 232, and the power-supply voltage Vcc3 is supplied to the collector of the transistor 113 through the inductor 233.

The amplified signal RF1 from the collector of the transistor 111 is supplied to the emitter of the transistor 112 and the emitter of the transistor 113 through the capacitor 221. The emitter of the transistor 112 and the emitter of the transistor 113 are grounded through the inductor 235.

When the bias current or voltage is supplied to the base of the transistor 112, the amplified signal RFout1 obtained by amplifying the RF signal is outputted from the collector of the transistor 112. When the bias current or voltage is supplied to the base of the transistor 113, the amplified signal RFout2 obtained by amplifying the RF signal is outputted from the collector of the transistor 113.

The power amplifier circuit 10 can select, by switching the transistors 112, 113, and 114 between the on state and the off state, a path through which an RF signal obtained by amplifying the RF signal RFin is outputted. Path selection enables the amplified RF signal to be outputted from a different path. In the power amplifier circuit 10, no switch is used that switches between output paths, and thus no loss due to a switch occurs. Hence, the power amplifier circuit 10 can be obtained that enables low power consumption.

Furthermore, the power amplifier circuit 10A according to the second embodiment further includes the switch 411 that is capable of connecting the base of the transistor 112 to a ground, and the switch 412 that is capable of connecting the base of the transistor 113 to the ground. When the bias current or voltage is supplied to the base of the transistor 112, the switch 411 can be controlled to be turned off, and the switch 412 can be controlled to be turned on. When the bias current or voltage is supplied to the base of the transistor 113, the switch 411 can be controlled to be turned on, and the switch 412 can be controlled to be turned off.

In the power amplifier circuit 10A, when the bias current or voltage is supplied to the base of the transistor 112, the switch 411 is controlled to be turned off, and the switch 412 is controlled to be turned on. The switch 412 is turned on, and the base of the transistor 113 is thereby connected to the ground. When the base of the transistor 113 is connected to the ground, a base-emitter voltage of the transistor 113 is made smaller. When the bias current or voltage is supplied to the base of the transistor 113, the switch 412 is controlled to be turned off, and the switch 411 is controlled to be turned on. Similarly, a base-emitter voltage of the transistor 112 is made smaller.

In the power amplifier circuit 10A, when a base-emitter voltage of a transistor that does not operate is made smaller, the transistor can be kept from performing an unintended amplification operation. Thus, the power amplifier circuit 10A enables an increase in the isolation between the transistors 112 and 113.

Furthermore, the power amplifier circuit 10B according to the third embodiment further includes the switch 414 that is capable of connecting the base of the transistor 112 and the emitter of the transistor 112, and the switch 415 that is capable of connecting the base of the transistor 113 and the emitter of the transistor 113. When the bias current or voltage is supplied to the base of the transistor 112, the switch 414 can be controlled to be turned off, and the switch 415 can be controlled to be turned on. When the bias current or voltage is supplied to the base of the transistor 113, the switch 414 can be controlled to be turned on, and the switch 415 can be controlled to be turned off.

In the power amplifier circuit 10B, the base and emitter of a transistor that does not operate are connected to each other. This connection makes a base-emitter voltage of the transistor smaller. When the base-emitter voltage of the transistor that does not operate is made smaller, the transistor can be kept from performing an unintended amplification operation. Thus, the power amplifier circuit 10B enables an increase in the isolation between the transistors 112 and 113.

Furthermore, the power amplifier module 20 according to the fourth embodiment includes the power amplifier circuit 10; the transmission filter 5011; and the transmission filter 5021. The input terminal of the transmission filter 5011 and the input terminal of the transmission filter 5021 are connected to each other without any switch. The amplified signal RFt1 having a frequency in the transmission frequency band of BAND 1 or in the transmission frequency band of BAND 3 is inputted to the input terminal of the transmission filter 5011 and the input terminal of the transmission filter 5021. In the transmission frequency band of BAND 1, the input impedance Zb2 of the input terminal of the transmission filter 5021 is higher than the input impedance Zb1 of the input terminal of the transmission filter 5011. In the transmission frequency band of BAND 3, the input impedance Zb1 of the input terminal of the transmission filter 5011 is higher than the input impedance Zb2 of the input terminal of the transmission filter 5021.

If the frequency band of the amplified signal RFt1 is BAND 1, the impedance Zb2 is higher than the impedance Zb1. Owing to a difference between these impedances, the amplified signal RFt1 attempts to flow not into the transmission filter 5021 but into mainly the transmission filter 5011.

If the frequency band of the amplified signal RFt1 is BAND 3, the impedance Zb1 is higher than the impedance Zb2. Owing to a difference between these impedances, the amplified signal RFt1 attempts to flow not into the transmission filter 5011 but into mainly the transmission filter 5021.

Hence, a band pass filter into which an amplified signal flows can be switched in accordance with a frequency band without using any switch. The amplified signal can be switched in accordance with a frequency band, thus enabling a reduction in loss due to a switch.

Furthermore, the power amplifier module 20 according to the fourth embodiment further includes the reception filter 5012 for the reception frequency band of BAND 1, and the reception filter 5022 for the reception frequency band of BAND 3. The transmission filter 5011 and the reception filter 5012 constitute the duplexer 501, and the transmission filter 5021 and the reception filter 5022 constitute the duplexer 502.

The duplexer 501 including the transmission filter 5011 and the reception filter 5012 serves as a filter for a signal in BAND 1. Similarly, the duplexer 502 serves as a filter for a signal in BAND 3. The duplexers are provided, thereby enabling the transmission and reception of signals using frequency bands. Hence, the power amplifier module can be provided which enables the transmission and reception of signals while reducing loss of an amplified signal due to a switch.

Furthermore, in the power amplifier module 20 according to the fourth embodiment, a frequency interval between the transmission frequency band of BAND 1 and the transmission frequency band of BAND 3 is larger than a frequency interval between the transmission frequency band of BAND 1 and the reception frequency band of BAND 1, or a frequency interval between the transmission frequency band of BAND 3 and the reception frequency band of BAND 3.

It can be made easier to increase an impedance in a frequency band that is not used as the frequency interval increases. When the impedance is increased, a difference between impedances can be increased. When the difference between impedances increases, the power leakage that occurs between a transmission filter and a reception filter for the same frequency band is inhibited. Thus, a loss caused by the supply of a signal from the power amplifier circuit 10 to the duplexer 501 can be made less than a loss caused by the impedance of the common input-output terminal included in the duplexer 501. Hence, the power amplifier module can be provided which enables a further reduction in loss.

The above-described embodiments are intended to facilitate understanding of the present disclosure, but are not intended for a limited interpretation of the present disclosure. The present disclosure can be changed or improved without departing from the gist thereof and includes the equivalents thereof. That is, appropriate design changes made to the embodiments by those skilled in the art are also included in the scope of the present disclosure as long as the changes have features of the present disclosure. For example, the elements included in the embodiments, and the arrangements, materials, conditions, shapes, sizes, and so forth of the elements are not limited to those exemplified in the embodiments and can be appropriately changed. Furthermore, the embodiments are merely illustrative, and it goes without saying that configurations described in different embodiments can be partially replaced or combined. Such replacement and such combination are also included in the scope of the present disclosure as long as the replacement and the combination have features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor;
a first bias circuit configured to supply a first bias current or voltage;
a first capacitor;

a first inductor;
a second inductor;
a second transistor;
a second bias circuit configured to supply a second bias current or voltage;
a third inductor;
a third transistor;
a third bias circuit configured to supply a third bias current or voltage;
a fourth inductor; and
either:
  a first switch configured to connect the base of the second transistor to a ground and a second switch configured to connect the base of the third transistor to the ground; or
  a third switch configured to connect the base of the second transistor and the emitter of the second transistor and a fourth switch configured to connect the base of the third transistor and the emitter of the third transistor,
wherein, when the second bias current or voltage is supplied to the base of the second transistor, the first switch or the third switch is configured to be turned off, and the second switch or the fourth switch is configured to be turned on,
wherein, when the third bias current or voltage is supplied to the base of the third transistor, the first switch or the third switch is configured to be turned on, and the second switch or the fourth switch is configured to be turned off,
wherein a first power-supply voltage is supplied to a collector of the first transistor through the first inductor,
wherein an emitter of the first transistor is grounded,
wherein a radio frequency signal is supplied to a base of the first transistor,
wherein a second power-supply voltage is supplied to a collector of the second transistor through the third inductor,
wherein the second power-supply voltage is supplied to a collector of the third transistor through the fourth inductor,
wherein a first amplified signal from the collector of the first transistor is supplied to an emitter of the second transistor and an emitter of the third transistor through the first capacitor,
wherein the emitter of the second transistor and the emitter of the third transistor are grounded through the second inductor,
wherein, when the second bias current or voltage is supplied to a base of the second transistor, a second amplified signal obtained by amplifying the radio frequency signal is outputted from the collector of the second transistor, and
wherein, when the third bias current or voltage is supplied to a base of the third transistor, a third amplified signal obtained by amplifying the radio frequency signal is outputted from the collector of the third transistor.

2. A power amplifier circuit comprising:
a first transistor;
a first bias circuit configured to supply a first bias current or voltage;
a first capacitor;
a first inductor;
a second inductor;
a second transistor;
a second bias circuit configured to supply a second bias current or voltage;
a third inductor;
a third transistor;
a third bias circuit configured to supply a third bias current or voltage; and
a fourth inductor,
wherein a first power-supply voltage is supplied to a collector of the first transistor through the first inductor,
wherein an emitter of the first transistor is grounded,
wherein a radio frequency signal is supplied to a base of the first transistor,
wherein a second power-supply voltage is supplied to a collector of the second transistor through the third inductor,
wherein the second power-supply voltage is supplied to a collector of the third transistor through the fourth inductor,
wherein a first amplified signal from the collector of the first transistor is supplied to an emitter of the second transistor and an emitter of the third transistor through the first capacitor,
wherein the emitter of the second transistor and the emitter of the third transistor are grounded through the second inductor,
wherein, when the second bias current or voltage is supplied to a base of the second transistor, a second amplified signal obtained by amplifying the radio frequency signal is outputted from the collector of the second transistor,
wherein, when the third bias current or voltage is supplied to a base of the third transistor, a third amplified signal obtained by amplifying the radio frequency signal is outputted from the collector of the third transistor, and
wherein the second transistor and the third transistor are configured to switch from an ON state to an OFF state based on the second bias current or voltage and the third bias current or voltage, respectively.

3. A power amplifier circuit comprising:
a first transistor;
a first bias circuit configured to supply a first bias current or voltage;
a first capacitor;
a first inductor;
a second inductor;
a second transistor;
a second bias circuit configured to supply a second bias current or voltage;
a third inductor;
a third transistor;
a third bias circuit configured to supply a third bias current or voltage;
a fourth inductor; and
at least one matching circuit connected to at least one of the collector of the second transistor or the collector of the third transistor,
wherein a first power-supply voltage is supplied to a collector of the first transistor through the first inductor,
wherein an emitter of the first transistor is grounded,
wherein a radio frequency signal is supplied to a base of the first transistor,
wherein a second power-supply voltage is supplied to a collector of the second transistor through the third inductor,
wherein the second power-supply voltage is supplied to a collector of the third transistor through the fourth inductor, wherein a first amplified signal from the collector of the first transistor is supplied to an emitter of the second transistor and an emitter of the third transistor through the first capacitor, wherein the emitter of the second transistor and the emitter of the third transistor are grounded through the second inductor, wherein, when the second bias current or voltage is supplied to a base of the second transistor, a second amplified signal obtained by amplifying the radio frequency signal is outputted from the collector of the second transistor, and wherein, when the third bias current or voltage is supplied to a base of the third transistor, a third amplified signal obtained by amplifying the radio frequency signal is outputted from the collector of the third transistor.

4. A power amplifier module comprising:

the power amplifier circuit according to claim 1;

a first transmission filter for a first transmission frequency band; and a second transmission filter for a second transmission frequency band, wherein an input terminal of the first transmission filter and an input terminal of the second transmission filter are connected to each other without any switch, wherein the second amplified signal that has a frequency in the first transmission frequency band or in the second transmission frequency band is inputted to the input terminal of the first transmission filter and the input terminal of the second transmission filter, wherein, in the first transmission frequency band, an input impedance of the input terminal of the second transmission filter is higher than an input impedance of the input terminal of the first transmission filter, and wherein, in the second transmission frequency band, an input impedance of the input terminal of the first transmission filter is higher than an input impedance of the input terminal of the second transmission filter.

5. A power amplifier module comprising:

the power amplifier circuit according to claim 2;

a first transmission filter for a first transmission frequency band; and a second transmission filter for a second transmission frequency band, wherein an input terminal of the first transmission filter and an input terminal of the second transmission filter are connected to each other without any switch, wherein the second amplified signal that has a frequency in the first transmission frequency band or in the second transmission frequency band is inputted to the input terminal of the first transmission filter and the input terminal of the second transmission filter, wherein, in the first transmission frequency band, an input impedance of the input terminal of the second transmission filter is higher than an input impedance of the input terminal of the first transmission filter, and wherein, in the second transmission frequency band, an input impedance of the input terminal of the first transmission filter is higher than an input impedance of the input terminal of the second transmission filter.

6. A power amplifier module comprising:

the power amplifier circuit according to claim 3;

a first transmission filter for a first transmission frequency band; and a second transmission filter for a second transmission frequency band, wherein an input terminal of the first transmission filter and an input terminal of the second transmission filter are connected to each other without any switch, wherein the second amplified signal that has a frequency in the first transmission frequency band or in the second transmission frequency band is inputted to the input terminal of the first transmission filter and the input terminal of the second transmission filter, wherein, in the first transmission frequency band, an input impedance of the input terminal of the second transmission filter is higher than an input impedance of the input terminal of the first transmission filter, and wherein, in the second transmission frequency band, an input impedance of the input terminal of the first transmission filter is higher than an input impedance of the input terminal of the second transmission filter.

7. The power amplifier module according to claim 4, further comprising:

a first reception filter for a first reception frequency band; and a second reception filter for a second reception frequency band, wherein the first transmission filter and the first reception filter constitute a first duplexer, and wherein the second transmission filter and the second reception filter constitute a second duplexer.

8. The power amplifier module according to claim 5, further comprising:

a first reception filter for a first reception frequency band; and a second reception filter for a second reception frequency band, wherein the first transmission filter and the first reception filter constitute a first duplexer, and wherein the second transmission filter and the second reception filter constitute a second duplexer.

9. The power amplifier module according to claim 6, further comprising:

a first reception filter for a first reception frequency band; and a second reception filter for a second reception frequency band, wherein the first transmission filter and the first reception filter constitute a first duplexer, and wherein the second transmission filter and the second reception filter constitute a second duplexer.

10. The power amplifier module according to claim 7, wherein a frequency interval between the first transmission frequency band and the second transmission frequency band is larger than a frequency interval between the first transmission frequency band and the first reception frequency band, or a frequency interval between the second transmission frequency band and the second reception frequency band.

11. The power amplifier module according to claim 8, wherein a frequency interval between the first transmission frequency band and the second transmission frequency band is larger than a frequency interval between the first transmission frequency band and the first reception frequency band, or a frequency interval between the second transmission frequency band and the second reception frequency band.

12. The power amplifier module according to claim 9, wherein a frequency interval between the first transmission frequency band and the second transmission frequency band is larger than a frequency interval between the first transmission frequency band and the first reception frequency band, or a frequency interval between the second transmission frequency band and the second reception frequency band.

13. The power amplifier circuit according to claim 3, wherein at least one of the second amplified signal and the third amplified signal is outputted by the at least one matching circuit.

14. The power amplifier circuit according to claim 1, wherein the radio frequency signal is supplied to the base of the first transistor through a second capacitor.

15. The power amplifier circuit according to claim 1, further comprising at least one matching circuit connected to at least one of the collector of the second transistor or the collector of the third transistor.

16. The power amplifier circuit according to claim 15, wherein at least one of the second amplified signal and the third amplified signal is outputted by the at least one matching circuit.

17. The power amplifier circuit according to claim 2, wherein the radio frequency signal is supplied to the base of the first transistor through a second capacitor.

18. The power amplifier circuit according to claim 3, wherein the radio frequency signal is supplied to the base of the first transistor through a second capacitor.

* * * * *